(12) United States Patent
Lee et al.

(10) Patent No.: US 10,276,629 B2
(45) Date of Patent: Apr. 30, 2019

(54) LIGHT EMITTING DEVICE PACKAGE

(71) Applicant: SAMSUNG ELECTRONICS CO., LTD., Suwon-si (KR)

(72) Inventors: Dong Kuk Lee, Suwon-si (KR); Yong Min Kwon, Seoul (KR); Hyung Kun Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 90 days.

(21) Appl. No.: 15/200,616

(22) Filed: Jul. 1, 2016

(65) Prior Publication Data

US 2017/0069681 A1 Mar. 9, 2017

(30) Foreign Application Priority Data

Sep. 4, 2015 (KR) .................. 10-2015-0125719

(51) Int. Cl.
*H01L 33/38* (2010.01)
*H01L 27/15* (2006.01)
(Continued)

(52) U.S. Cl.
CPC .......... *H01L 27/153* (2013.01); *H01L 33/505* (2013.01); *H01L 33/54* (2013.01);
(Continued)

(58) Field of Classification Search
CPC ..... H01L 27/153; H01L 33/20; H01L 33/385; H01L 33/46; H01L 2933/0016;
(Continued)

(56) References Cited

U.S. PATENT DOCUMENTS 6,372,608 B1 4/2002 Shimoda et al.
6,645,830 B2 11/2003 Shimoda et al.
(Continued)

FOREIGN PATENT DOCUMENTS

CN 103633221 A 3/2014
CN 103633233 A 3/2014
(Continued)

OTHER PUBLICATIONS

Communication dated Aug. 3, 2018, issued by the State Intellectual Property Office of P.R. China in counterpart Chinese Application No. 201610738437.4.
(Continued)

*Primary Examiner* — William F Kraig
*Assistant Examiner* — Khatib A Rahman
(74) *Attorney, Agent, or Firm* — Sughrue Mion, PLLC

(57) ABSTRACT

A light emitting device package and a method of manufacturing the light emitting device package are provided. The light emitting package includes a light emitting stack including a first conductivity-type semiconductor layer, an active layer, a second conductivity-type semiconductor layer sequentially stacked, and having a first surface provided by the first conductivity-type semiconductor layer and a second surface provided by the second conductivity-type semiconductor layer and opposing the first surface; a first electrode structure disposed on a portion of the first surface and connected to the first conductivity-type semiconductor layer; a sealing portion disposed adjacent to the light emitting stack; an insulating layer disposed between the light emitting stack and the sealing portion; and a first metal pad disposed on the second surface and passing through the insulating layer at a side of the light emitting stack to connect to the first electrode structure.

10 Claims, 25 Drawing Sheets

(51) Int. Cl.
  *H01L 33/62* (2010.01)
  *H01L 33/54* (2010.01)
  *H01L 33/60* (2010.01)
  *H01L 33/50* (2010.01)
  *H01L 33/46* (2010.01)
  *H01L 33/20* (2010.01)

(52) U.S. Cl.
  CPC .............. *H01L 33/60* (2013.01); *H01L 33/62* (2013.01); *H01L 33/20* (2013.01); *H01L 33/38* (2013.01); *H01L 33/385* (2013.01); *H01L 33/46* (2013.01); *H01L 2933/005* (2013.01); *H01L 2933/0016* (2013.01); *H01L 2933/0025* (2013.01); *H01L 2933/0041* (2013.01); *H01L 2933/0066* (2013.01)

(58) Field of Classification Search
  CPC ..... H01L 2933/0025; H01L 2933/0041; H01L 2933/005; H01L 2933/0066; H01L 33/50–33/508; H01L 33/22
  See application file for complete search history.

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,956,368 B2 | 6/2011 | Nagai et al. |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,618,560 B2 | 12/2013 | D'Evelyn et al. |
| 8,686,429 B2 | 4/2014 | Bergmann et al. |
| 8,735,931 B2 | 5/2014 | Han et al. |
| 8,759,863 B2 | 6/2014 | Sugizaki et al. |
| 8,766,295 B2 | 7/2014 | Kim |
| 8,941,124 B2 | 1/2015 | Kojima et al. |
| 8,952,416 B2 | 2/2015 | Jeong |
| 8,957,402 B2 * | 2/2015 | Kojima ................... H01L 33/22 257/13 |
| 9,006,764 B2 * | 4/2015 | Akimoto ............... H01L 33/507 257/98 |
| 9,048,368 B2 | 6/2015 | Jeong |
| 9,653,667 B2 | 5/2017 | Jeong et al. |
| 2011/0297972 A1 | 12/2011 | Seo et al. |
| 2013/0015483 A1 | 1/2013 | Shimokawa et al. |
| 2013/0240931 A1 | 9/2013 | Akimoto et al. |
| 2015/0034900 A1* | 2/2015 | Aihara .................... H01L 33/20 257/13 |
| 2015/0236228 A1 | 8/2015 | Kim et al. |
| 2015/0243846 A1 | 8/2015 | Kwon et al. |
| 2015/0303352 A1* | 10/2015 | Jeong ................... H01L 33/385 257/98 |
| 2015/0372207 A1* | 12/2015 | Kim ....................... H01L 33/62 257/98 |
| 2016/0240759 A1* | 8/2016 | Chae ...................... H01L 33/62 |
| 2016/0276538 A1* | 9/2016 | Zhao ..................... H01L 33/385 |
| 2016/0351755 A1 | 12/2016 | Lee et al. |

FOREIGN PATENT DOCUMENTS

| | | |
|---|---|---|
| CN | 103682070 A | 3/2014 |
| KR | 10-0752719 B1 | 8/2007 |
| KR | 10-2015-0097021 A | 8/2015 |
| KR | 10-2015-0101311 A | 9/2015 |
| KR | 10-2016-0141063 A | 12/2016 |

OTHER PUBLICATIONS

Communication dated Mar. 5, 2019, issued by the State Intellectual Property Office of P.R. China in counterpart Chinese Application No. 201610738437.4.

* cited by examiner

LIGHT EMITTING DEVICE PACKAGE

CROSS-REFERENCE TO RELATED APPLICATION

This application claims priority from Korean Patent Application No. 10-2015-0125719, filed on Sep. 4, 2015 in the Korean Intellectual Property Office, the disclosure of which is incorporated herein by reference.

BACKGROUND

Apparatuses, devices, methods, and articles of manufacture consistent with the present inventive concept relate to a light emitting device package.

Light emitting diodes (LED) may allow a material included therein to emit light using electric energy, and convert energy generated by a recombination of electrons and holes of bonded semiconductors into light. Such LEDs are being widely used as light sources of lighting devices and backlight devices for large liquid crystal displays, and the development of LEDs is gradually accelerating.

Recently, commercialization of mobile phone backlights, vehicle turn signal lamps, camera flashes, and the like using gallium nitride (GaN)-based LEDs is spurring general lighting using LEDs to be actively developed. Incorporating LEDs in backlights of large televisions, automobile headlamps, or general lamps, is gradually expanding to areas of large, high-output, and high-efficiency products, and LEDs are becoming more versatile.

SUMMARY

Further, one or more example embodiments provide a light emitting device package with improved light extraction efficiency.

Further still, one or more example embodiments provide a method of manufacturing a light emitting device package which enables simplified manufacturing processes and a reduced cost of manufacturing.

According to an aspect of an example embodiment, there is provided a light emitting device package including a light emitting stack including a first conductivity-type semiconductor layer, an active layer, a second conductivity-type semiconductor layer sequentially stacked, and having a first surface provided by the first conductivity-type semiconductor layer and a second surface provided by the second conductivity-type semiconductor layer, the second surface and opposing the first surface; a sealing portion disposed adjacent to the light emitting stack; a first electrode structure disposed on a portion of the first surface and connected to the first conductivity-type semiconductor layer; an insulating layer disposed between the light emitting stack and the sealing portion; and a first metal pad disposed on the second surface, and passing through the insulating layer at a side of the light emitting stack to connect to the first electrode structure.

The light emitting device package may further include a second electrode structure disposed on the second surface and connected to the second conductivity-type semiconductor layer; and a second metal pad disposed on the second surface, and passing through the insulating layer to connect to the second electrode structure.

The first electrode structure may surround the light emitting stack along an edge of the first surface.

The first electrode structure may surround at least a portion of an upper surface of the insulating layer disposed adjacent to the first surface.

The first electrode structure may include a first region disposed on an edge of the first surface, and a plurality of second regions extending from the first region inside of the first surface.

The plurality of second regions may include a plurality of electrode fingers each extending from a side of the first surface.

The light emitting device package may further include a reflective metal layer covering at least a portion of the insulating layer that is disposed adjacent to the first surface.

The reflective metal layer may be separated from the first electrode structure.

The first and second metal pads may be separated from each other on the second surface, and cover a side surface of the light emitting stack and extend adjacent to the first surface.

The first metal pad may pass through the insulating layer in a plurality of regions separated from each other, such that the first metal pad is connected to the first electrode structure.

The first metal pad may surround the second metal pad and the first metal pad extends outside of the light emitting stack.

At least a portion of the insulating layer may be disposed in a region between portions of the second electrode structure on the second surface.

The first electrode structure may be disposed on the first surface to correspond to the at least the portion of the insulating layer.

The insulating layer may have a multilayer reflective structure in which a plurality of insulator films having different refractive indexes are alternately stacked.

The sealing portion may include light-reflective particles.

The light emitting device package may further include a first metal post and a second metal post connected to the first metal pad and the second metal pad, respectively, and each of the first and second metal posts have regions exposed from the sealing portion.

The first surface may have an uneven pattern.

The first conductivity-type semiconductor layer may have a phosphor layer.

According to an aspect of another example embodiment, there is provided a light emitting device package including a plurality of light emitting stacks each including a first conductivity-type semiconductor layer, an active layer, a second conductivity-type semiconductor layer sequentially stacked, and each of the light emitting stacks having a first surface provided by the first conductivity-type semiconductor layer, and a second surface provided by the second conductivity-type semiconductor layer and opposing the first surface; a first electrode structure disposed on a portion of the first surface of each of the light emitting stacks and connected to the first conductivity-type semiconductor layer of one of the light emitting stacks; a second electrode structure disposed on the second surface of each of the light emitting stacks and connected to the second conductivity-type semiconductor layer of another one of the light emitting stacks; a sealing portion disposed adjacent to the light emitting stacks; an insulating layer disposed between the light emitting stacks and the sealing portion; a first metal pad disposed on the second surface, and passing through the insulating layer at a side of the one of the light emitting stacks to connect to the first electrode structure; and an interconnecting portion disposed between the light emitting stacks, and passing through the insulating layer to connect the first electrode structure of the one of the light emitting stacks to a second electrode structure of the another one of the light emitting stacks.

The light emitting device package may further include a second metal pad disposed on the second surface, and passing through the insulating layer to connect to the second electrode structure of the another one of the light emitting stacks.

According to an aspect of another example embodiment, there is provided a method of manufacturing a light emitting device package, the method including forming a light emitting stack having a mesa structure on a substrate, the light emitting stack including a first conductivity-type semiconductor layer, an active layer, and a second conductivity-type semiconductor layer sequentially stacked; forming a second electrode structure on the second conductivity-type semiconductor layer; forming an insulating layer on the light emitting stack and the substrate; forming at least one first through hole exposing the substrate adjacent to the light emitting stack and at least one second through hole exposing the second electrode structure by removing portions of the insulating layer; forming a first metal pad filling the at least one first through hole, and a second metal pad filling the at least one second through hole on the insulating layer, the second metal pad being separated from the first metal pad; removing the substrate to expose the first conductivity-type semiconductor layer; and forming a first electrode structure electrically connected to the first metal pad on a portion of the first conductivity-type semiconductor layer.

The forming of the at least one first through hole may include forming a plurality of first through holes along a periphery of the light emitting stack.

The forming of the first electrode structure may further include forming a reflective metal layer disposed along a periphery of the light emitting stack and covering an upper surface of the insulating layer.

The second electrode structure may be formed on portions of the second conductivity-type semiconductor layer, and at least a portion of the insulating layer is disposed in a region between the portions of the second electrode structure on the second conductivity-type semiconductor layer.

The first electrode structure may be disposed on the first conductivity-type semiconductor layer to correspond to the at least the portion of the insulating layer disposed in the region between the portions of the second electrode structure.

The method may further include forming a first metal post on the first metal pad, and forming a second metal post on the second metal pad; and forming a sealing portion encapsulating the first and second metal pads and the first and second metal posts on the substrate.

The method may further include after the removing the substrate, forming an uneven pattern on an upper surface of the first conductivity-type semiconductor layer.

The method may further include forming a phosphor layer on the first conductivity-type semiconductor layer.

The forming of the light emitting stack having the mesa structure may include growing sequentially and epitaxially the first conductivity-type semiconductor layer, the active layer, and the second conductivity-type semiconductor layer on the substrate; and etching the first conductivity-type semiconductor layer, the active layer, and the second conductivity-type semiconductor layer to expose the substrate.

The forming of the light emitting stack may include forming a plurality of light emitting stacks, and the at least one first through hole and the at least one second through hole are formed in each of the plurality of light emitting stacks.

The forming of the first and second metal pads may include forming an interconnecting portion between two adjacent light emitting stacks of the plurality of light emitting stacks, the interconnecting portion electrically connecting the at least one first through hole of one of the two adjacent light emitting stacks and the at least one second through hole formed in the other of the two adjacent light emitting stacks.

According to an aspect of another example embodiment, there is provided a light emitting device package including a light emitting stack having a plurality of layers arranged in a mesa structure; a first electrode structure disposed to cover edges of the light emitting stack while exposing a upper conductive layer of the light emitting stack, the first electrode structure electrically connected to the upper conductive layer; a second electrode structure disposed on and electrically connected to a bottom conductive surface of the light emitting stack; an insulating layer disposed on the second electrode structure and sides of the light emitting stack, and extending under a portion of the first electrode structure; a first metal pad disposed on the insulating layer, the first metal pad being electrically connected to the first electrode structure through at least one first hole in the insulating layer; and a second metal pad disposed on the insulating layer, the second metal pad being electrically connected to the second electrode structure through at least one second hole in the insulating layer.

The first electrode structure may include a first region disposed on edges of the upper conductive layer, and a plurality of second regions extending from the first region along the upper conductive layer.

The plurality of second regions may include a plurality of electrode fingers.

The light emitting device package may further comprise a reflective metal layer covering at least a portion of the insulating layer that is disposed adjacent to the light emitting stack.

The reflective metal layer may be separated from the first electrode structure.

The exposed portion of the upper conductive layer may have an uneven pattern

BRIEF DESCRIPTION OF DRAWINGS

The above and/or other aspects will be more clearly understood from the following detailed description of example embodiments taken in conjunction with the accompanying drawings, in which.

DETAILED DESCRIPTION

Figure 1:
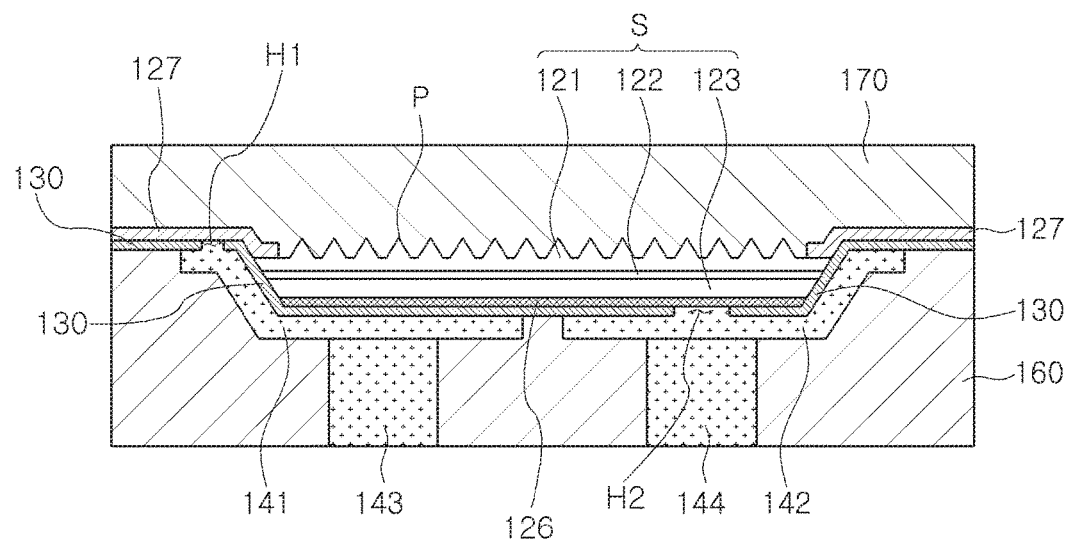
FIG. 1 is a schematic cross-sectional view of a light emitting device package according to an example embodiment.

Hereinafter, example embodiments of the present disclosure will be described as follows with reference to the attached drawings.

The present disclosure may, however, be embodied in many different forms and should not be construed as being limited to the specific example embodiments set forth herein. Rather, these example embodiments are provided so that this disclosure will be thorough and complete, and will fully convey the scope of the disclosure to those skilled in the art.

Throughout the specification, it will be understood that when an element, such as a layer, region or substrate, is referred to as being "on," "connected to," or "coupled to" another element, it may be directly "on," "connected to," or "coupled to" the other element or other elements intervening therebetween may be present. In contrast, when an element is referred to as being "directly on," "directly connected to," or "directly coupled to" another element, there are no elements or layers intervening therebetween. Like numerals refer to like elements throughout. As used herein, the term "and/or" includes any and all combinations of one or more of the associated listed items.

It will be apparent that though the terms "first", "second", "third", etc. may be used herein to describe various members, components, regions, layers and/or sections, these members, components, regions, layers and/or sections should not be limited by these terms. These terms are only used to distinguish one member, component, region, layer or section from another region, layer or section. Thus, a "first" member, component, region, layer or section discussed below could be termed a "second" member, component, region, layer or section without departing from the teachings of the example embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular example embodiments only and is not intended to be limiting of the present disclosure. As used herein, the singular forms "a," "an," and "the" are intended to include the plural forms as well, unless the context clearly indicates otherwise. It will be further understood that the terms "includes," "including," "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, example embodiments will be described with reference to the drawings. In the drawings, for example, due to manufacturing techniques and/or tolerances, modifications of the shape shown may be estimated. Thus, example embodiments should not be construed as being limited to the particular shapes of regions shown in the drawings herein, but rather should be construed to, for example, include a change in shape due to manufacturing. The following example embodiments may also be constituted as one or a combination thereof.

The contents of the present disclosure described below may have a variety of configurations and propose only exemplary configurations herein, but are not limited thereto.

Figure 2:
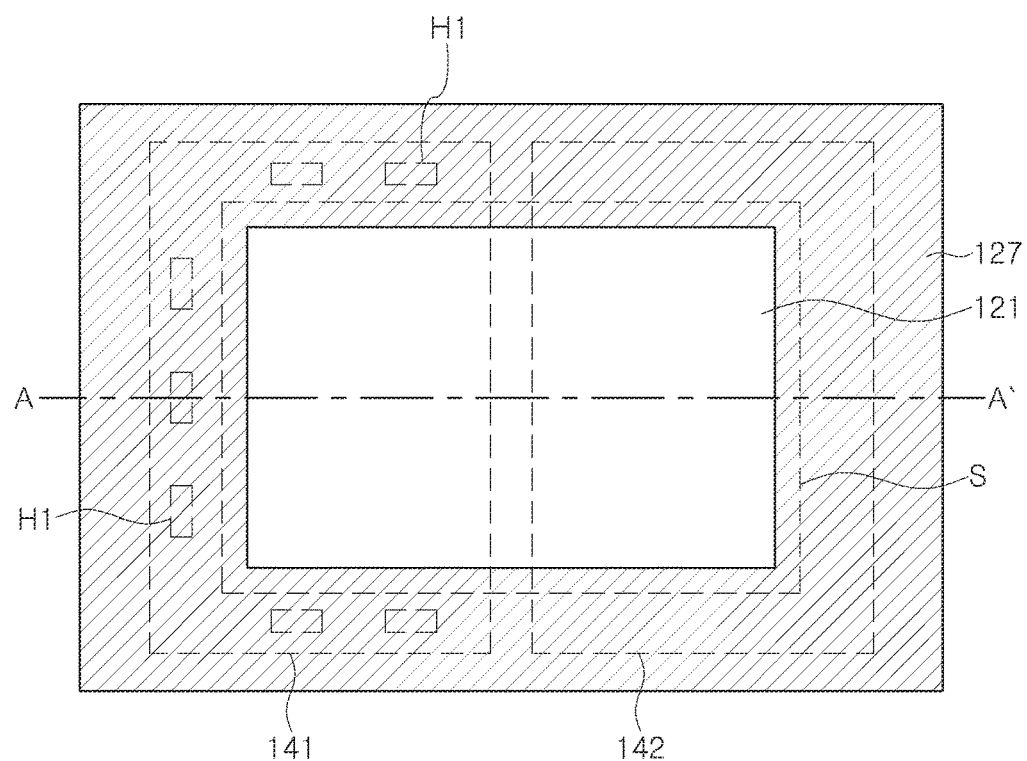
FIG. 2 is a plan view of the light emitting device package of FIG. 1.
Figure 3:
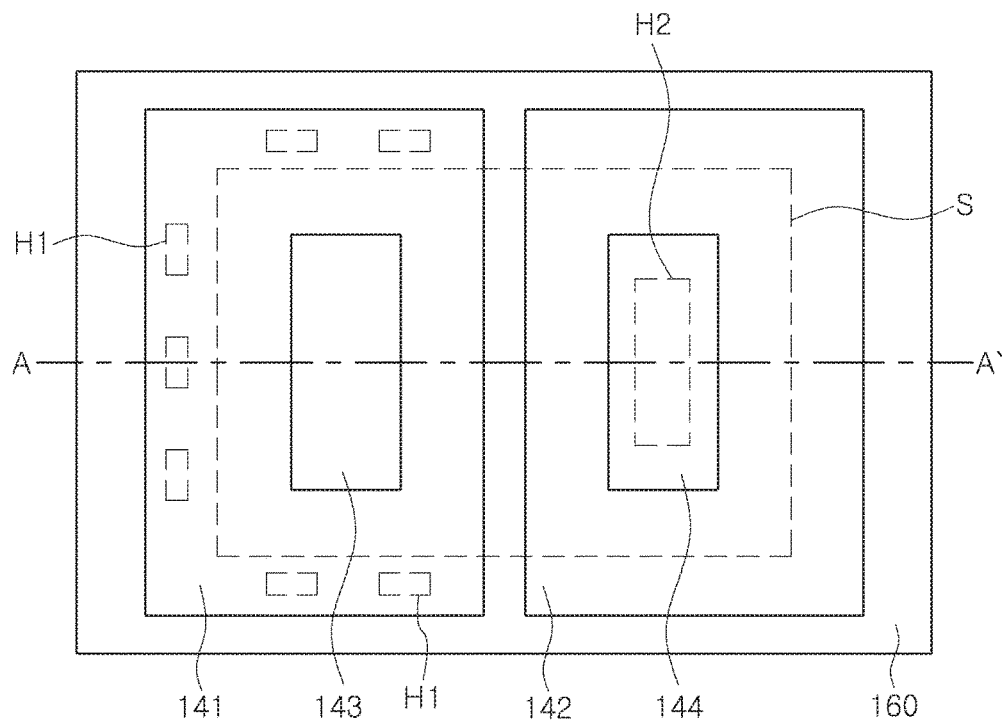
FIG. 3 is a rear view of the light emitting device package of FIG. 1.

FIG. 1 is a schematic cross-sectional view of a light emitting device package according to an example embodiment. FIG. 2 is a plan view of a light emitting device package according to an example embodiment. FIG. 3 is a rear view of a light emitting device package according to an example embodiment. FIG. 1 is a cross-sectional view taken along lines A-A' of FIGS. 2 and 3. A light emitting device package according to an example embodiment may be provided as a chip scale package using a vertical light emitting device.

Referring to FIGS. 1 through 3, a light emitting device package may include a light emitting stack (S), a first electrode structure 127 and a second electrode structure 126 connected to the light emitting stack (S), an insulating layer 130, a first metal pad 141, a second metal pad 142, a first metal post 143 connected to the first metal pad 141, a second metal post 144 connected to the second metal pad 142, and a sealing portion 160.

The light emitting stack (S) may include a first conductivity-type semiconductor layer 121, an active layer 122, and a second conductivity-type semiconductor layer 123. The light emitting stack (S) may have a first surface provided by the first conductivity-type semiconductor layer 121, a second surface provided by the second conductivity-type semiconductor layer 123, the second surface opposing the first surface, and side surfaces positioned between the first and second surfaces. The first surface of the first conductivity-type semiconductor layer 121 may have an uneven pattern (P) formed thereon to improve light extraction efficiency.

The first conductivity-type semiconductor layer 121 may be a nitride semiconductor layer satisfying n-type $In_xAl_yGa_{1-x-y}N$ ($0 \le x < 1$, $0 \le y < 1$, $0 \le x+y < 1$), and an n-type impurity may be Si, Ge, Se, Te, and the like. The active layer 122 may be a multiple quantum well (MQW) structure in which quantum well layers and quantum barrier layers are alternately stacked on each other. For example, the quantum well layers and the quantum barrier layers may be $In_xAl_yGa_{1-x-y}N$ ($0 \le x \le 1$, $0 \le y \le 1$, $0 \le x+y \le 1$) having different compositions. In a certain example, the quantum well layers may be $In_xGa_{1-x}N$ ($0 < x \le 1$), and the quantum barrier layers may be GaN or AlGaN. The second conductivity-type semiconductor layer 123 may be a nitride semiconductor layer satisfying p-type $In_xAl_yGa_{1-x-y}N$ ($0 \le x < 1$, $0 \le y < 1$, $0 \le x+y < 1$), and a p-type impurity may be Mg, Zn, Be, and the like.

The first electrode structure 127 may be disposed on a portion of the first surface of the light emitting stack (S) and may be connected to the first conductivity-type semiconductor layer 121. The first electrode structure 127 may be disposed to surround the light emitting stack (S) along the edges of the first surface of the light emitting stack (S). The first electrode structure 127 may be disposed to cover an upper surface of the insulating layer 130 disposed around the first surface as well as to cover the edges of the first surface. In some example embodiments, the first electrode structure 127 may be disposed to cover an entire upper surface of the insulating layer 130. In other example embodiments, the first electrode structure 127 may cover at least a portion of the upper surface of the insulating layer 130 disposed around the first surface.

Unlike a related art light emitting device package having a first electrode structure in such a manner of passing through a second conductivity-type semiconductor layer and an active layer of a light emitting stack to be connected to a first conductivity-type semiconductor layer, the light emitting device package according to an example embodiment may allow the first electrode structure 127 to be formed on the edge of the first surface of the light emitting stack (S) without removing the active layer 122, thereby increasing a light emitting area, as compared to the structure of the related art light emitting device package.

The second electrode structure 126 may be disposed on the second surface of the light emitting stack (S) and connected to the second conductivity-type semiconductor layer 123. The second electrode structure 126 may cover a lower surface of the second conductivity-type semiconductor layer 123. In some example embodiments, the second electrode structure 126 may cover an entire lower surface of the second conductivity-type semiconductor layer 123. In other example embodiments, the second electrode structure 126 may cover a portion of the lower surface of the second conductivity-type semiconductor layer 123. For example, in some example embodiments, the second electrode structure 126 may be spaced apart from one or more edges of the lower surface of the second conductivity-type semiconductor layer 123. The second electrode structure 126 disposed in the latter manner prevents a current flowing between the first electrode structure 127 and the second electrode structure 126 from being concentrated along the side surfaces of the light emitting stack (S). In order to improve current flow, the second electrode structure 126 may be modified in various example embodiments depending on the pattern of the first electrode structure 127.

The first and second electrode structures 127 and 126 may be reflective. The first and second electrode structures 127 and 126 may contain a material such as Ag, Ni, Al, Cu, Rh, Pd, Ir, Ru, Mg, Zn, Pt, Au, or Sn, and may be employed as a structure having at least two layers, such as Ni/Ag, Zn/Ag, Cu/Ag, Ni/Al, Zn/Al, Pd/Ag, Pd/Al, Ir/Ag, Ir/Au, Pt/Ag, Pt/Al, or Ni/Ag/Pt.

The sealing portion 160 may be disposed adjacently to the light emitting stack (S). The sealing portion 160 may be disposed to surround the light emitting stack (S), the first and second metal pads 141 and 142, and the first and second metal posts 143 and 144. Lower surfaces of the first and second metal posts 143 and 144 may be exposed from the sealing portion 160. The first surface of the light emitting stack (S) may be exposed from the sealing portion 160. Because the sealing portion 160 is used to support a light emitting device, the sealing portion 160 may have a high Young's modulus, and may be formed using a material having high thermal conductivity in order to emit heat generated by the light emitting device. The sealing portion 160 may be, for example, an epoxy resin or a silicone resin. The sealing portion 160 may also contain light-reflective particles to reflect light emitted from the light emitting stack (S). The light-reflective particles may include titanium dioxide ($TiO_2$) and/or aluminum oxide ($Al_2O_3$), but are not limited thereto.

The insulating layer 130 may be disposed between the light emitting stack (S) and the sealing portion 160. In more detail, the insulating layer 130 may be disposed between the light emitting stack (S) and the first and second metal pads 141 and 142. The insulating layer 130 may also be disposed on the sealing portion 160 adjacent to the light emitting stack (S).

As shown in FIGS. 2-3, the insulating layer 130 may include at least one first through hole (H1) at a side of the light emitting stack (S). In some example embodiments, the insulating layer 130 may include a plurality of first through holes (H1) at a plurality of sides of the light emitting stack (S). In other example embodiments, the insulating layer 130 may include first through holes (H1) separated from each other along the periphery of the light emitting stack (S). As shown in FIG. 3, the insulating layer 130 may include at least one second through hole (H2) on the second surface of the light emitting stack (S). The numbers, arrangements, and shapes of the first through holes (H1) and the second through holes (H2) are not limited to those shown in FIGS. 1 to 3.

The insulating layer 130 may be formed using any material having electrical insulating properties as well as a material having low light absorption. For example, the insulating layer 130 may be formed using one or more of silicon oxide, silicon oxynitride, and silicon nitride. In some example embodiments, the insulating layer 130 may have a multilayer reflective structure in which a plurality of insulator films having different refractive indexes are alternately stacked. For example, the multilayer reflective structure may be a distributed Bragg reflector (DBR) in which a first insulator film having a first refractive index and a second insulator film having a second refractive index are alternately stacked. The multilayer reflective structure may have the plurality of insulator films having different refractive indexes and repeatedly stacked from 2 to about 100 times. In some example embodiments, the plurality of insulator films may be repeatedly stacked from 3 to about 70 times. In other example embodiments, the plurality of insulator films may be repeatedly stacked from 4 to about 50 times. Each of the plurality of insulator films included in the multilayer reflective structure may be an oxide such as $SiO_2$, $TiO_2$, $Al_2O_3$, or $ZrO_2$, a nitride such as SiN, $Si_3N_4$, TiN, AlN, TiAlN, or TiSiN, and/or a oxynitride such as $SiO_xN_y$. For example, when the wavelength of light generated by the active layer 122 is defined as lambda ($\lambda$), and n is defined as a refractive index of a corresponding layer, the first and second insulator films may have a thickness of $\lambda/4n$, for example, a thickness of about 300 Å to about 900 Å. The multilayer reflective structure may be configured according to refractive indexes and thicknesses of the first and second insulator films, respectively, so as to have high reflectivity (about 95% or more) for the wavelength of light generated by the active layer 122.

The first and second metal pads 141 and 142 may be disposed to be separated from each other on the second surface of the light emitting stack (S), and may extend adjacently to the first surface of the light emitting stack (S). The first metal pad 141 may pass through the insulating layer 130 in a plurality of regions separated from each other to connect to the first electrode structure 127. For example, the first metal pad 141 may be connected to the first electrode structure 127 through the first through holes (H1) in the insulating layer 130. The second metal pad 142 may pass through the insulating layer 130 on the second surface of the light emitting stack (S) to connect to the second electrode structure 126. For example, the second metal pad 142 may be connected to the second electrode structure 126 through the second through holes (H2) in the insulating layer 130.

The first and second metal pads 141 and 142 may have a seed layer including a reflective metal layer. The first and second metal pads 141 and 142 may be formed of copper (Cu), but are not limited thereto, and may be formed of a conductive material other than Cu.

The first and second metal posts 143 and 144 respectively connected to the first and second metal pads 141 and 142 may be formed of a same material as that of the first and second metal pads 141 and 142. The first and second metal posts 143 and 144 may be connected to an external power source through the lower surfaces thereof exposed from the sealing portion 160.

The light emitting device package may have a phosphor layer 170 formed on the first conductivity-type semiconductor layer 121 to convert at least a portion of the wavelength of light emitted by the active layer 122. The phosphor layer 170 may also be formed on the first electrode structure 127. The phosphor layer 170 may be formed by dispersing phosphor particles in a transparent resin. The phosphor particles will be described below.

As such, when the phosphor layer 170 is provided on the first conductivity-type semiconductor layer 121 providing a main light emitting surface, light emitted with a wavelength converted by the phosphor particles included in the phosphor layer 170, or light totally reflected from a surface of the phosphor layer 170, may be absorbed by the sealing portion 160 below the phosphor layer 170. However, according to some example embodiments, the first electrode structure 127 having light reflectivity may be disposed to extend above the sealing portion 160, and light may thus be prevented from being absorbed by the sealing portion 160 in the region covered by the first electrode structure 127.

FIGS. 4 to 9 are plan views of a first electrode structure of a light emitting device package according to various example embodiments, respectively.

Figure 4:
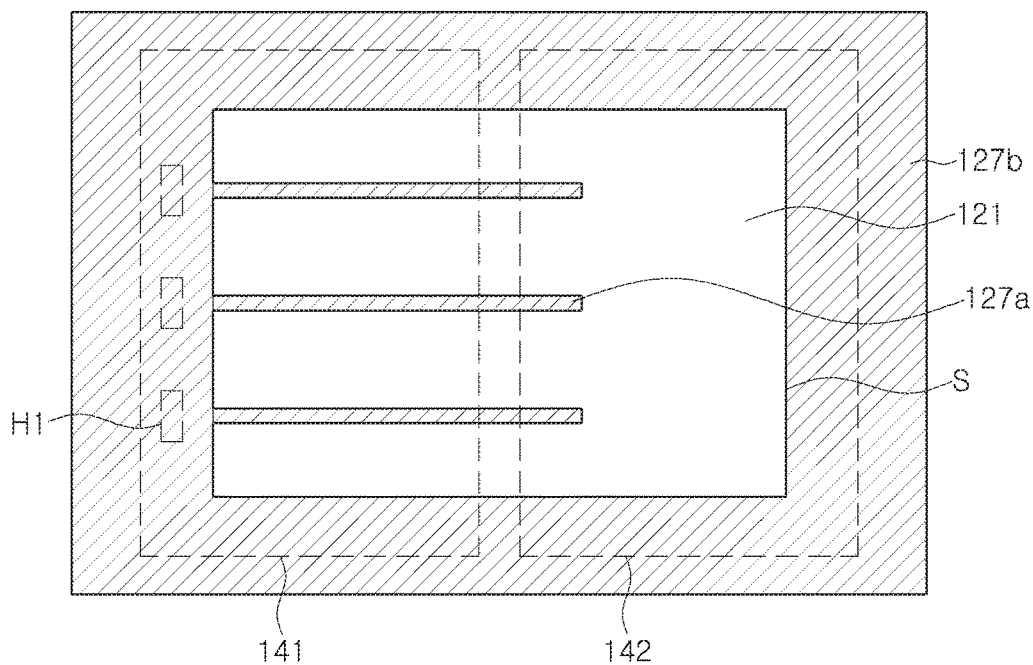
FIGS. 4 to 9 are plan views of a first electrode structure of a light emitting device package, according to various example embodiments, respectively.

Referring to FIG. 4, a light emitting device package according to an example embodiment may include a first electrode structure including a first region 127b disposed on the insulating layer 130 (refer to FIG. 1) along the edges of a first surface of a light emitting stack (S), and a second region 127a extending from the first region 127b toward an inside of the first surface to connect to a first conductivity-type semiconductor layer 121. The first region 127b may function as a reflective layer.

For example, the second region 127a may include a plurality of electrode fingers extending from a side of the first surface. The second region 127a is not limited to the structure and configuration shown in FIG. 4, and the structure and configuration of the second region 127a of the first electrode structure may be variously modified in consideration of various current distribution characteristics.

Figure 5:
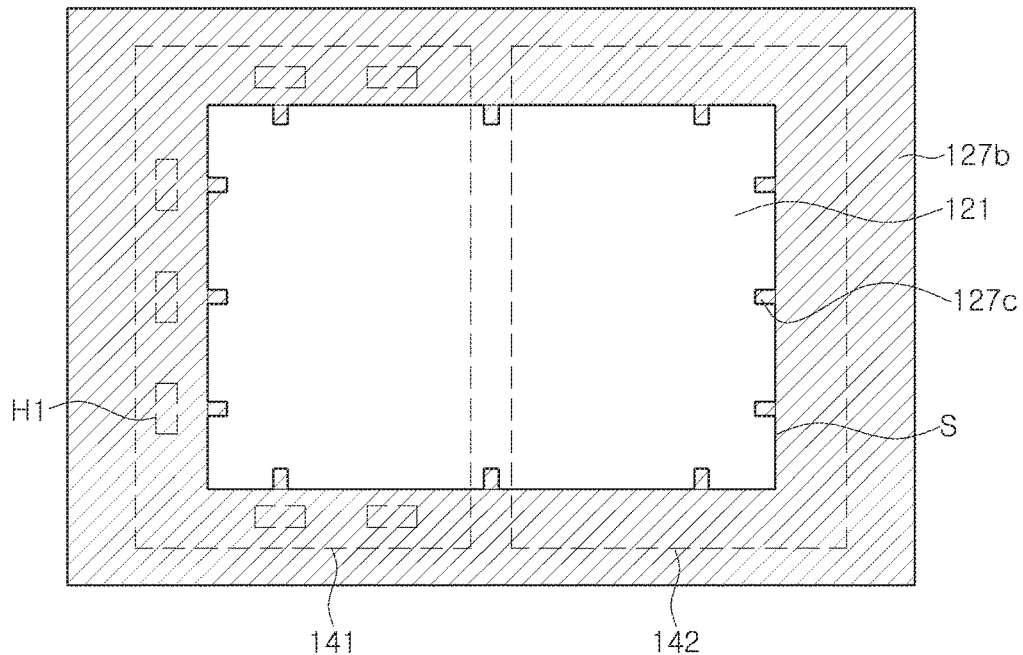

Referring to FIG. 5, a light emitting device package according to an example embodiment may include a first electrode structure including a first region 127b disposed on the insulating layer 130 (refer to FIG. 1) along the edges of a first surface of a light emitting stack (S), and a second region 127c extending from the first region 127b toward an inside of the first surface to be connected to a first conductivity-type semiconductor layer 121. The first region 127b may function as a reflective layer.

The second region 127c may include a plurality of electrode fingers disposed at intervals along one or more edges of the first surface. The second region 127c is not limited to the structure or configuration shown in FIG. 5, and the structure and configuration of the second region 127c of the first electrode structure may be variously modified in consideration of current distribution characteristics.

Figure 6:
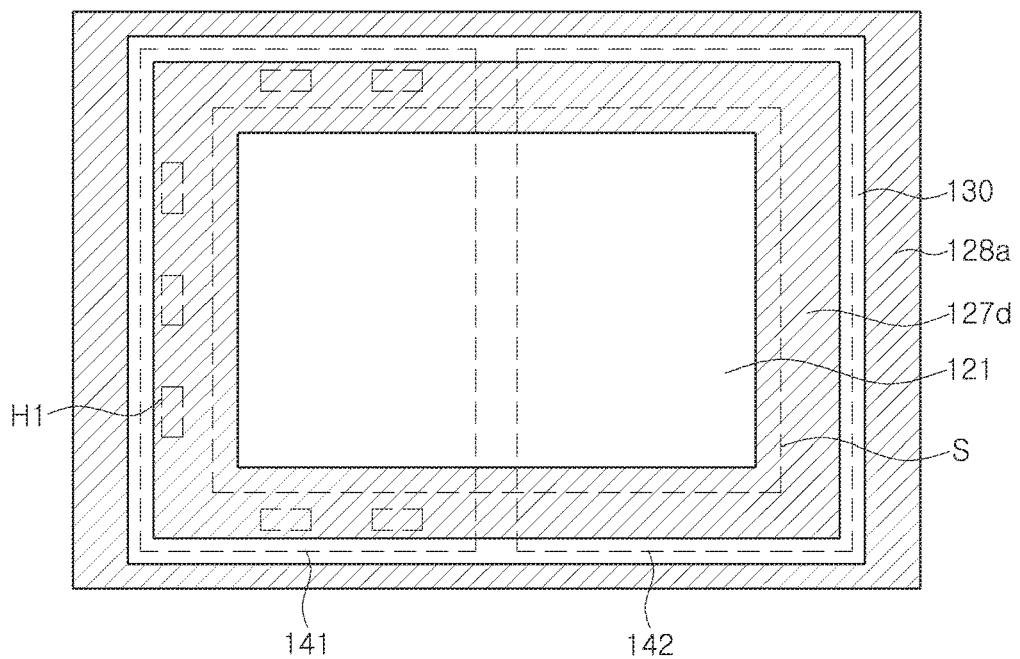

Referring to FIG. 6, a light emitting device package according to an example embodiment may further include a reflective metal layer 128a covering at least a portion of the insulating layer 130 disposed adjacently to a first surface of a light emitting stack (S). As a modification of the first electrode structure 127 illustrated in FIG. 2, a first electrode structure 127d may be disposed to surround the light emitting stack (S) along the edges of the first surface of the light emitting stack (S), and may be disposed to cover a portion of an upper surface of an insulating layer 130 disposed adjacently to the first surface as well as to cover the edges of the first surface. The reflective metal layer 128a may be separated from the first electrode structure 127d, and may be disposed to surround the first electrode structure 127d.

Figure 7:
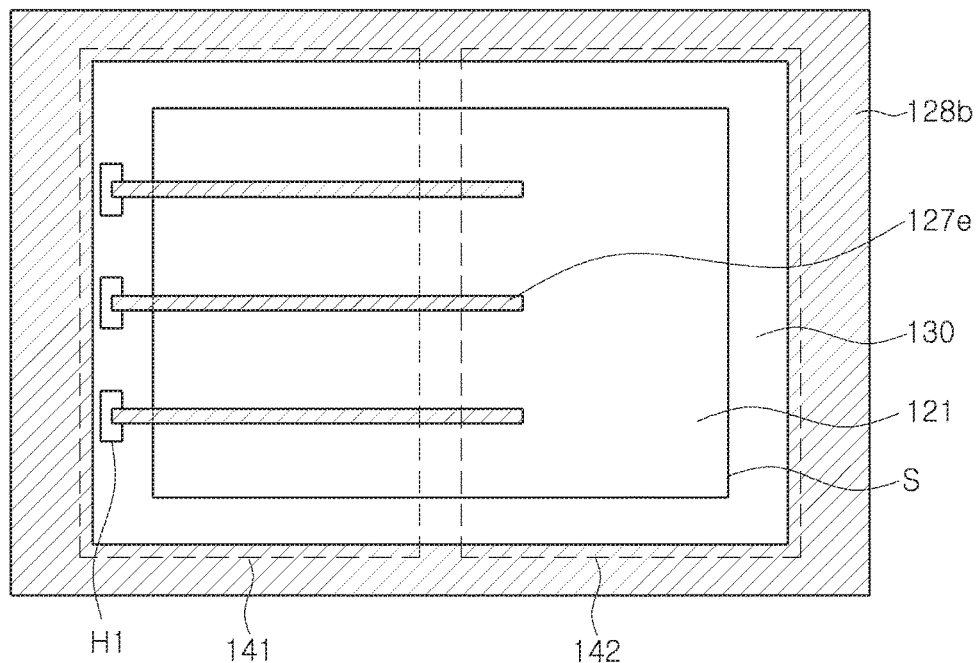

Referring to FIG. 7, a light emitting device package according to an example embodiment may further include a reflective metal layer 128b covering at least a portion of the insulating layer 130 disposed adjacently to a first surface of a light emitting stack (S). A first electrode structure 127e may include a plurality of electrode fingers extending from a side of a first conductivity-type semiconductor layer 121. The first electrode structure 127e may be connected to the first metal pad 141 through first through holes (H1) disposed at a side of the light emitting stack (S). The plurality of electrode fingers are not limited to the structure and configuration shown in FIG. 7, and the structure and configuration of the plurality of electrode fingers may be variously modified in consideration of various current distribution characteristics.

Figure 8:
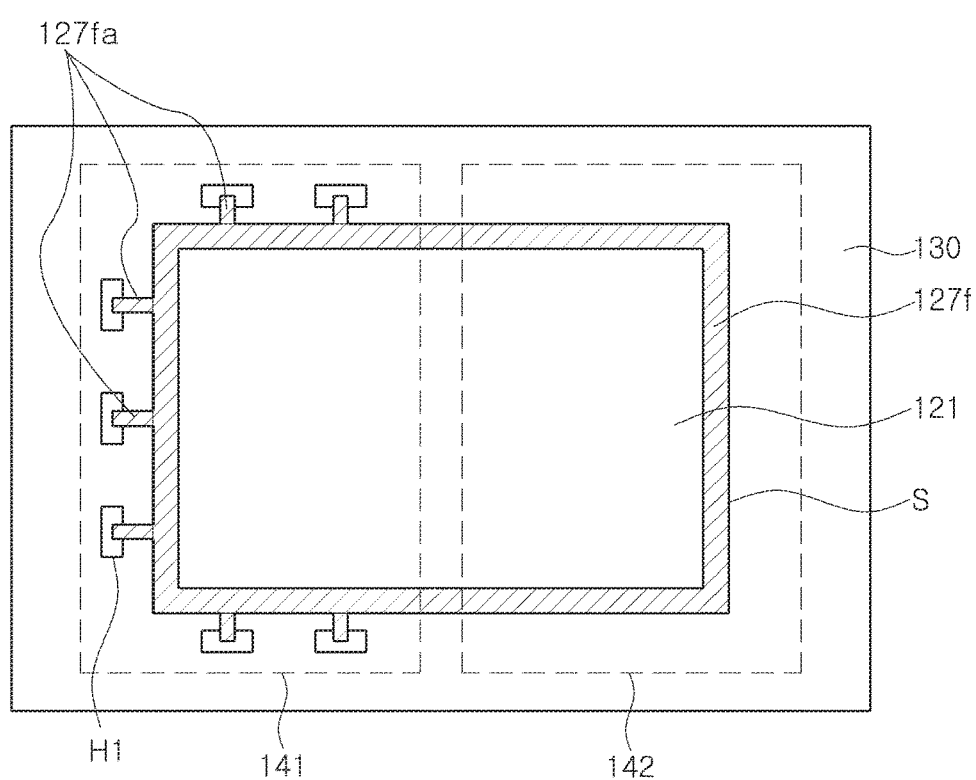

Referring to FIG. 8, a light emitting device package according to an example embodiment may include a first electrode structure 127f disposed to surround a light emitting stack (S) along the edges of a first surface of a light emitting stack (S). The first electrode structure 127f may be disposed to cover the edges of the first surface. The first electrode structure 127f may be connected to a first metal pad 141 through first through holes (H1) disposed adjacently to the light emitting stack (S). The first electrode structure 127f may include portions 127fa extending to the first through holes (H1) from the edges of the first surface to connect to the first metal pad 141. In this case, the insulating layer 130 may advantageously have a multilayer reflective structure in which a plurality of insulator films having different refractive indexes are alternately stacked.

Figure 9:
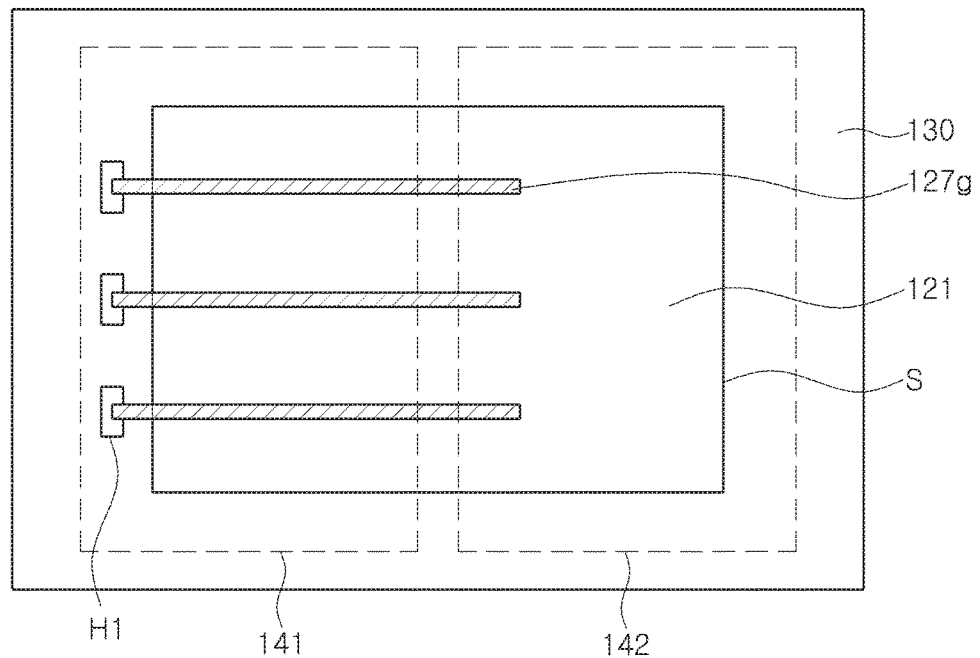

Referring to FIG. 9, a light emitting device package according to an example embodiment may include a first electrode structure 127g including a plurality of electrode fingers extending from a side of a first conductivity-type semiconductor layer 121. The first electrode structure 127g may be connected to a first metal pad 141 through first through holes (H1) of an insulating layer 130 disposed at a side of a light emitting stack (S). In this case, the insulating layer 130 may advantageously have a multilayer reflective structure in which a plurality of insulator films having different refractive indexes are alternately stacked. The plurality of electrode fingers are not limited to the structure and configuration shown in FIG. 9, and the structure and configuration of the plurality of electrode fingers may be variously modified in consideration of various current distribution characteristics FIG. 10 is a rear view of metal pads of a light emitting device package according to an example embodiment.

Figure 10:
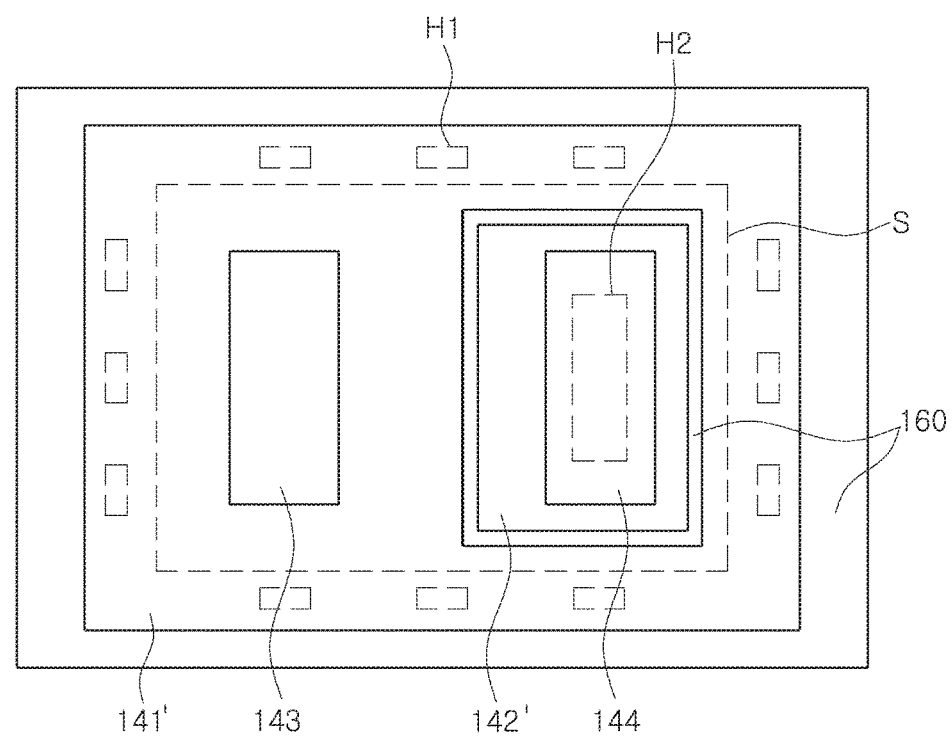
FIG. 10 is a rear view of metal pads of a light emitting device package according to an example embodiment.

Referring to FIG. 10, a light emitting device package according to an example embodiment may include a first metal pad 141' disposed to surround a second metal pad 142', covering side surfaces of a light emitting stack (S), and extending adjacently to the light emitting stack (S). The first metal pad 141' may pass through the insulating layer 130 (refer to FIG. 1) in a plurality of regions separated from each other along the periphery of the light emitting stack (S) to connect to the first electrode structure 127 (refer to FIG. 1). For example, the first metal pad 141' may be connected to the first electrode structure 127 through a plurality of first through holes (H1) separated from each other along the periphery of the light emitting stack (S).

Figure 11:
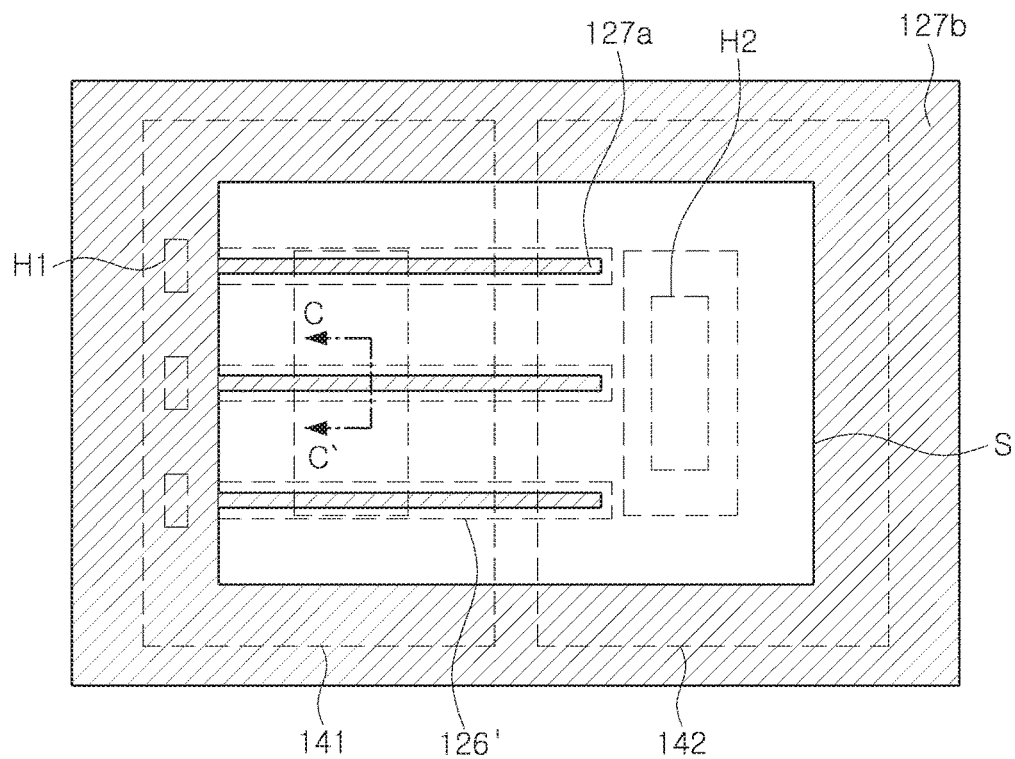
FIG. 11 is a plan view of the layout of a first electrode structure and a second electrode structure of a light emitting device package according to an example embodiment.
Figure 12:
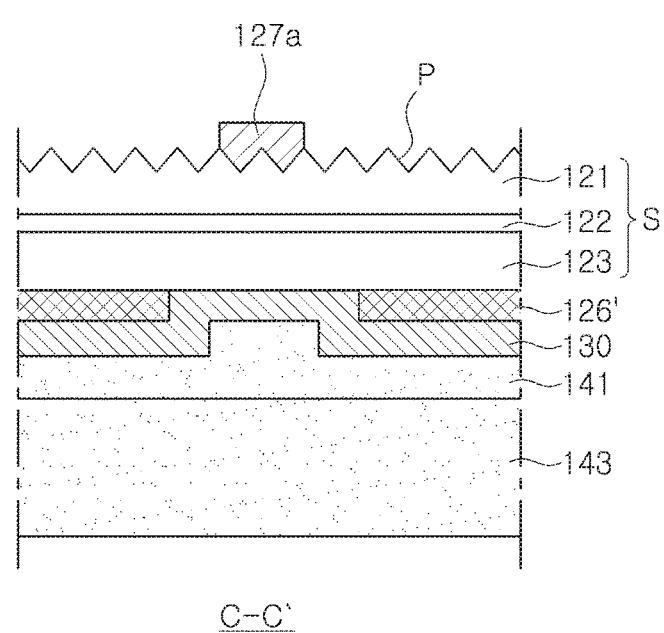
FIG. 12 is a cross-sectional view of the layout of a first electrode structure and a second electrode structure of a light emitting device package according to an example embodiment.

FIG. 11 is a plan view of the layout of a first electrode structure and a second electrode structure of a light emitting device package according to an example embodiment. FIG. 12 is a cross-sectional view of the layout of a first electrode structure and a second electrode structure of a light emitting device package according to an example embodiment. FIG. 12 is a cross-sectional view taken along line C-C' of FIG. 11.

Referring to FIGS. 11 and 12, as viewed from the top of the light emitting device package, a first electrode structure 127a and a second electrode structure 126' may be disposed to not overlap each other. At least a portion of the insulating layer 130 may be disposed between portions of the second electrode structure 126' on a second surface of a light emitting stack (S). The first electrode structure 127a may be disposed on a first surface of the light emitting stack (S) to correspond to the insulating layer 130 disposed between the portions of the second electrode structure 126'. In such an electrode layout, the insulating layer 130 disposed between the portions of the second electrode structure 126' may function as a current blocking layer to improve current distribution characteristics.

A method of manufacturing the light emitting device package illustrated in FIG. 1, according to an example embodiment will hereinafter be described.

FIGS. 13A through 13I are cross-sectional views of a method of manufacturing a light emitting device package according to an example embodiment.

Figure 13A:
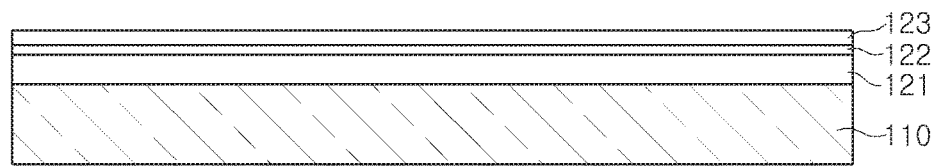
FIGS. 13A to 13I are cross-sectional views of a method of manufacturing a light emitting device package according to an example embodiment.

Referring to FIG. 13A, a first conductivity-type semiconductor layer 121, an active layer 122, and a second conductivity-type semiconductor layer 123 may be grown sequentially and epitaxially on a substrate 110.

The substrate 110 may be sapphire, SiC, Si, $MgAl_2O_4$, MgO, $LiAlO_2$, $LiGaO_2$, or GaN. The substrate 110 and the first conductivity-type semiconductor layer 121 may have a buffer layer provided therebetween. The buffer layer may be $In_xAl_yGa_{1-x-y}N$ ($0 \leq x \leq 1$, $0 \leq y \leq 1$). For example, the buffer layer may be formed at a low temperature in a range of 500° C. to 600° C., and may be intentionally undoped GaN, AlN, AlGaN, or InGaN. In some example embodiments, the buffer layer may also be formed by combining a plurality of layers or gradually changing a composition of the buffer layer.

The first conductivity-type semiconductor layer 121 may be a nitride semiconductor layer satisfying n-type $In_xAl_yGa_{1-x-y}N$ ($0 \leq x < 1$, $0 \leq y < 1$, $0 \leq x+y < 1$). The active layer 122 may have a multiple quantum well (MQW) structure in which quantum well layers and quantum barrier layers are alternately stacked on each other. For example, the quantum well layers and the quantum barrier layers may be $In_xAl_yGa_{1-x-y}N$ ($0 \leq x \leq 1$, $0 \leq y \leq 1$, $0 \leq x+y \leq 1$) having different compositions. The second conductivity-type semiconductor layer 123 may be a nitride semiconductor layer satisfying p-type $In_xAl_yGa_{1-x-y}N$ ($0 \leq x < 1$, $0 \leq y < 1$, $0 \leq x+y < 1$).

Figure 13B:
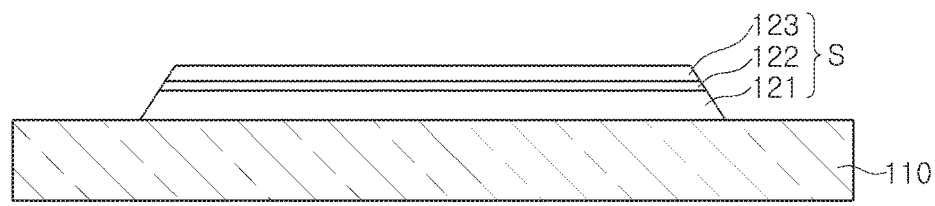

Next, referring to FIG. 13B, the first conductivity-type semiconductor layer 121, the active layer 122, and the second conductivity-type semiconductor layer 123 may be etched to certain sizes using a mask pattern such as a photoresist and thus a portion of the substrate 110 may be exposed, thereby forming a light emitting stack (S) having a mesa structure.

A single light emitting stack (S) having a mesa structure is illustrated in FIG. 13B for convenience, but in some example embodiments, a plurality of light emitting stacks (S) may be formed.

Figure 13C:
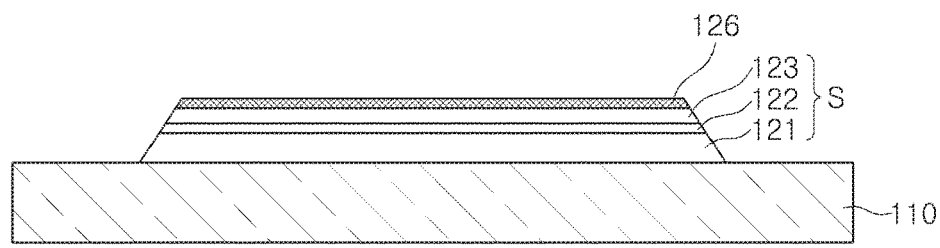

Next, referring to FIG. 13C, a second electrode structure 126 may be formed on the second conductivity-type semiconductor layer 123 of the light emitting stack (S).

A photoresist pattern exposing the second conductivity-type semiconductor layer 123 of the light emitting stack (S) is formed on the substrate 110, and a conductive material may then be deposited on the photoresist pattern and the second conductivity-type semiconductor layer 123. Subsequently, the photoresist pattern may be removed in a lift-off manner, and the second electrode structure 126 may be formed on the second conductivity-type semiconductor layer 123.

Figure 13D:
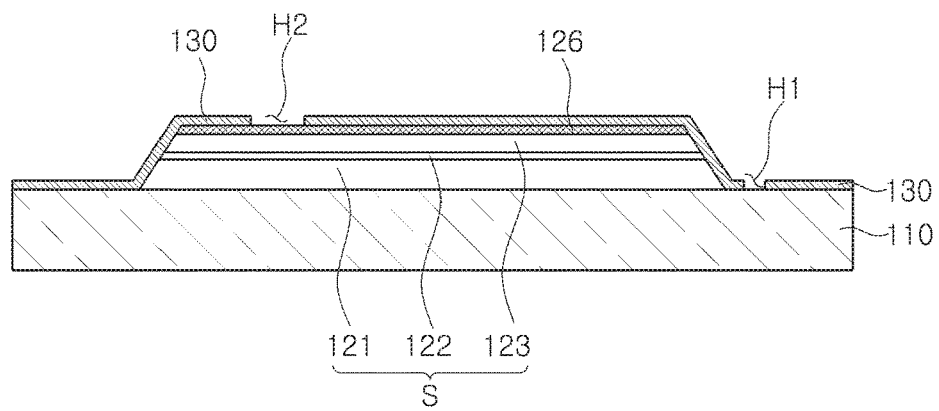

Next, referring to FIG. 13D, an insulating layer 130 having at least one first through hole H1 and at least one second through hole H2 may be formed.

The insulating layer 130 may be formed on the substrate 110 to cover the light emitting stack (S), and portions of the insulating layer 130 may then be etched using a photoresist pattern as a mask, and the at least one first through hole H1 exposing the substrate 110 at the periphery of the light emitting stack (S) and the at least one second through hole (H2) exposing the second electrode structure 126 may thus be formed. In some example embodiments, a plurality of first through holes (H1) may be formed along the periphery of the light emitting stack (S).

Figure 13E:
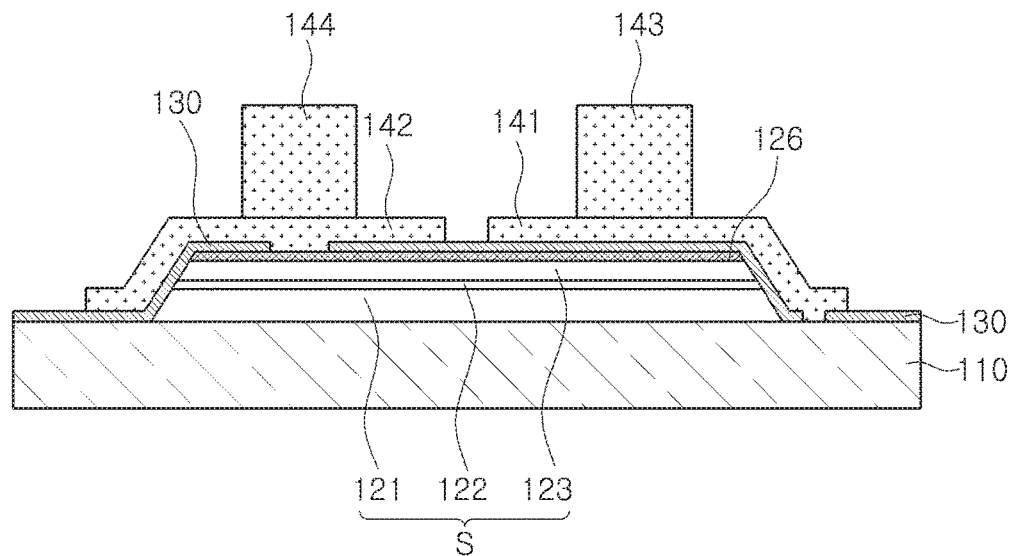

Next, referring to FIG. 13E, a first metal pad 141 and a second metal pad 142 may be formed on the insulating layer 130, and a first metal post 143 and a second metal post 144 may be formed on the first metal pad 141 and the second metal pad 142, respectively.

The first and second metal pads 141 and 142 may be formed by a plating process using a seed layer. The seed layer may include a reflective metal layer. The first metal pad 141 may fill the at least one first through hole H1, and the second metal pad 142 may fill the at least one second through hole H2. The first and second metal pads 141 and 142 may be spaced apart from each other so as to not be electrically connected. The first and second metal pads 141 and 142 may be formed of copper (Cu), but are not limited thereto, and may be formed of a conductive material other than Cu.

Subsequently, the first and second metal posts 143 and 144 may be formed by a plating process. In some example embodiments, the first and second metal posts 143 and 144 may be formed of a same material to that of the first and second metal pads 141 and 142.

In order to conduct the plating process, a photoresist pattern defining regions in which the first and second metal pads 141 and 142 are to be formed, or regions in which the first and second metal posts 143 and 144 are to be formed, may be formed. The photoresist pattern may be removed by a strip process after the plating process is completed.

Figure 13F:
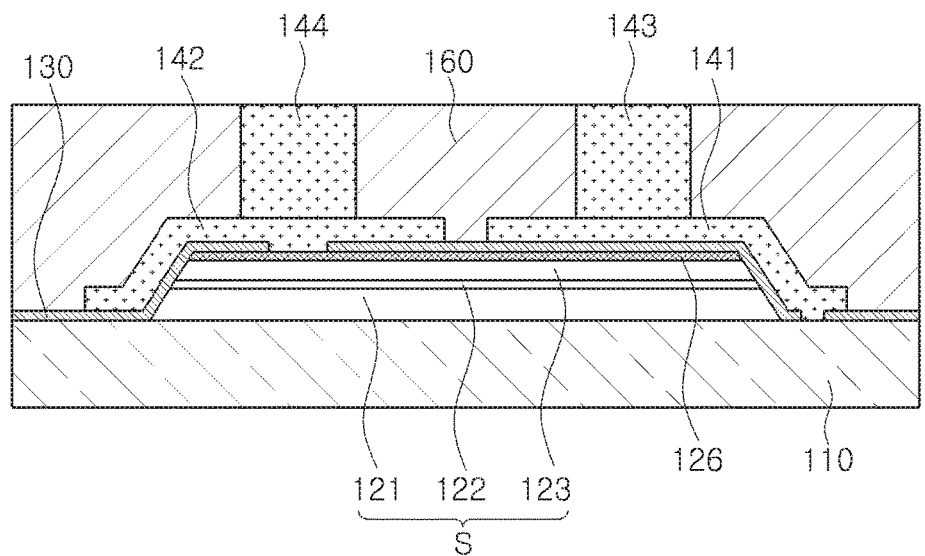

Referring to FIG. 13F, a sealing portion 160 encapsulating the first and second metal pads 141 and 142 and the first and second metal posts 143 and 144 may be formed on the substrate 110.

The sealing portion 160 may be formed by a process of applying a sealing material to cover the first and second metal posts 143 and 144 up to upper portions thereof, and by a process exposing ends of the first and second metal posts 143 and 144 using a flattening process such as grinding.

Figure 13G:
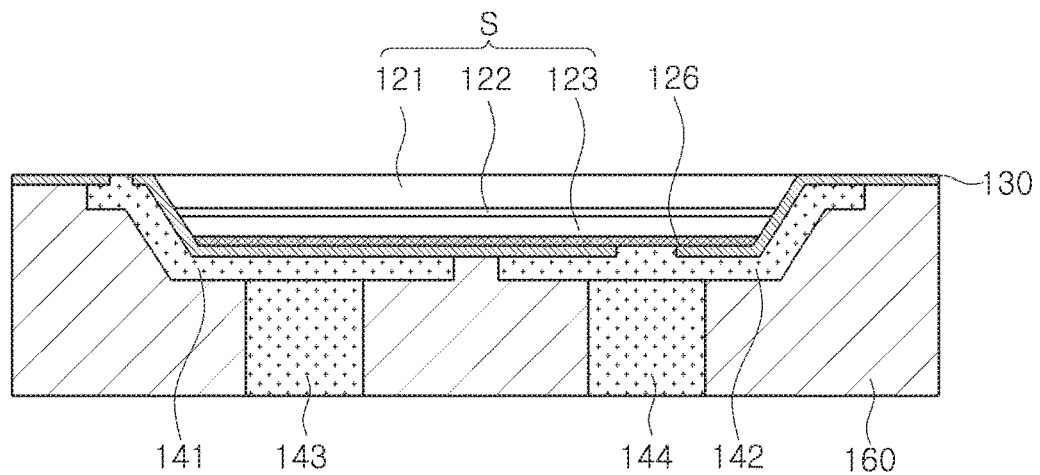

Next, referring to FIG. 13G, a process of removing the substrate 110 may be conducted, and thus the first conductivity-type semiconductor layer 121 and the insulating layer 130 may be exposed.

A support substrate may be attached to the sealing portion 160. Next, when the substrate 110 is provided as a transparent substrate such as sapphire, the substrate 110 may be separated from the light emitting stack (S) using a laser lift-off (LLO) process. A laser used in the LLO process may be at least one of a 193 nm excimer laser, a 248 nm excimer laser, a 308 nm excimer laser, an Nd:YAG laser, an He—Ne laser, and an Ar ion laser. In addition, when the substrate 110 is provided as an opaque substrate, such as a Si substrate, the substrate 110 may be removed by a method such as grinding or polishing.

Figure 13H:
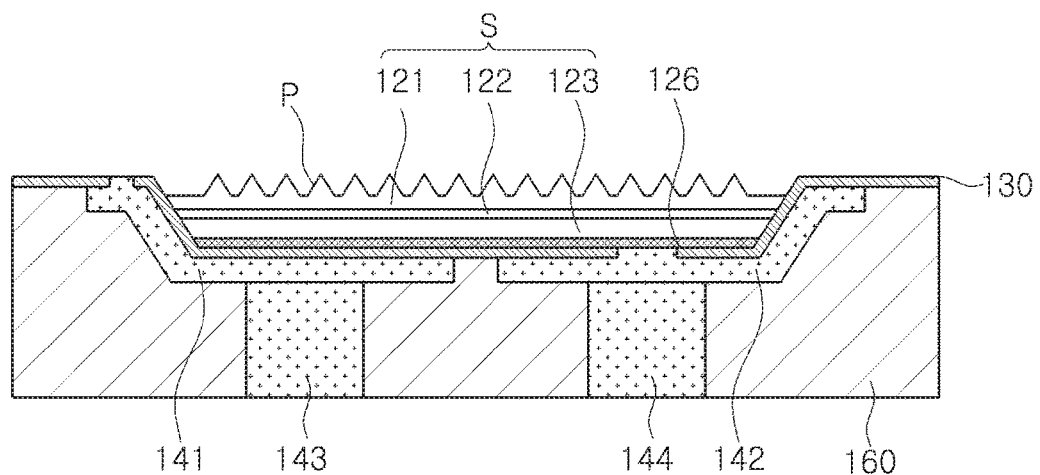

Next, referring to FIG. 13H, after the substrate 110 is removed, an uneven pattern (P) may then be formed on an upper surface of the first conductivity-type semiconductor layer 121 to improve light emission efficiency.

The uneven pattern (P) may be formed by, for example, a wet etching process using a solution containing KOH or NaOH, or a dry etching process using an etch gas containing a $BCl_3$ gas.

Figure 13I:
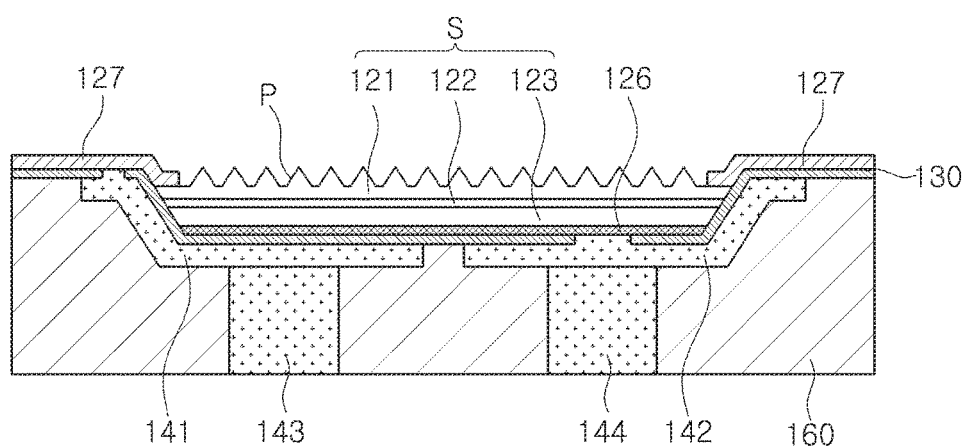

Next, referring to FIG. 13I, a first electrode structure 127 may be formed on the first conductivity-type semiconductor layer 121.

A conductive material may be deposited on the first conductivity-type semiconductor layer 121, the conductive material may then be etched using a photoresist pattern as a mask, and the first electrode structure 127 disposed on the edges of the first conductivity-type semiconductor layer 121 may thus be formed. The first electrode structure 127 may cover an upper surface of the insulating layer 130 along the periphery of the light emitting stack (S).

Next, a phosphor layer 170 may be formed on the light emitting stack (S), a process cutting individual packages may be finally performed, and the light emitting device package illustrated in FIG. 1 may thus be formed. The phosphor layer 170 may also be formed on the first electrode structure 127 adjacently to the light emitting stack (S).

Figure 14:
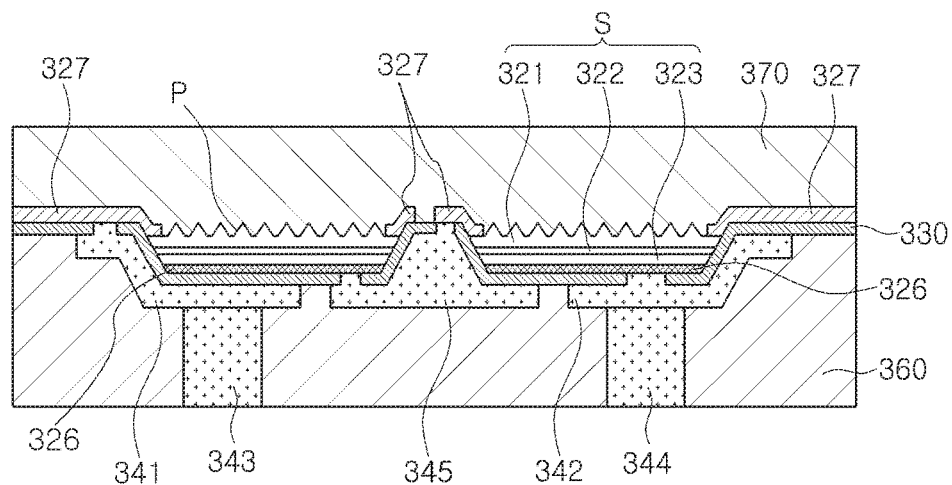
FIG. 14 is a schematic cross-sectional view of a light emitting device package according to an example embodiment.
Figure 15:
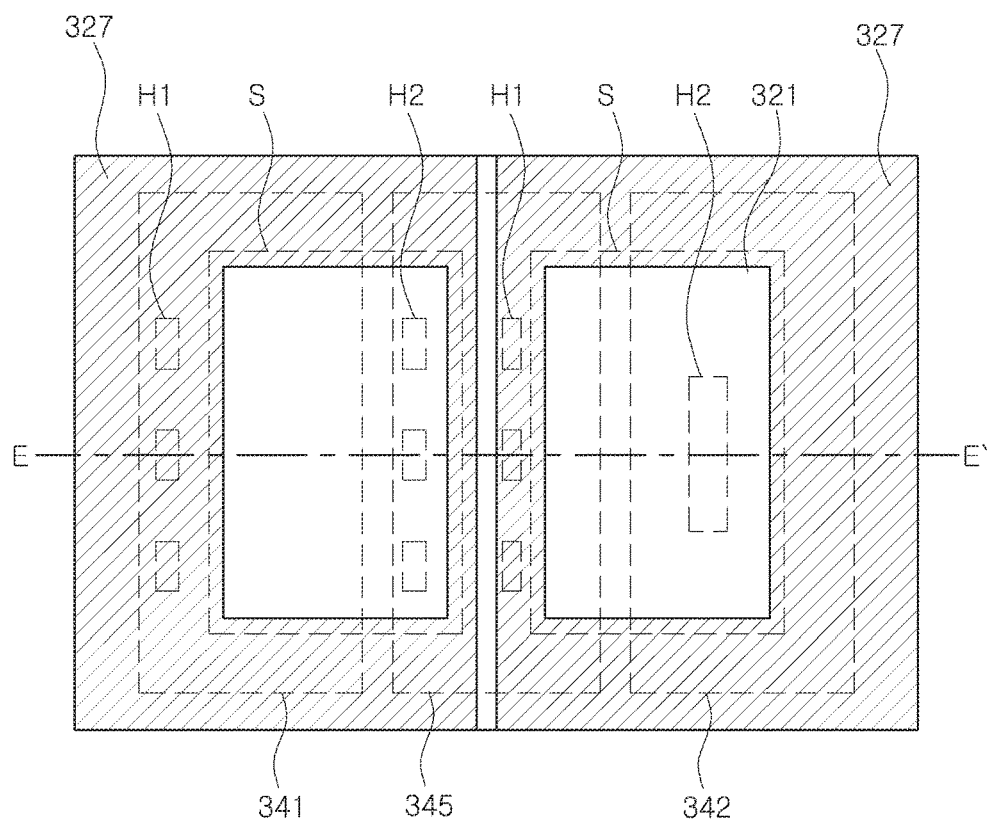
FIG. 15 is a plan view of the light emitting device package of FIG. 14.
Figure 16:
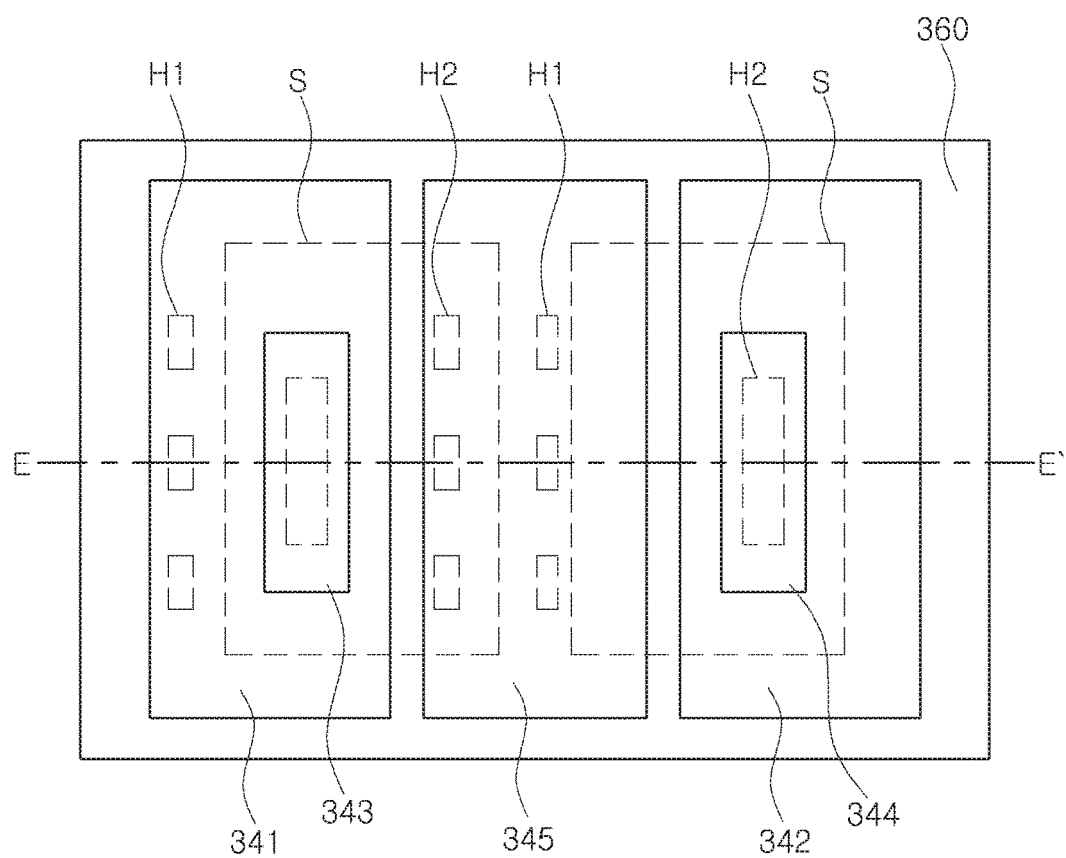
FIG. 16 is a rear view of the light emitting device package of FIG. 14.

FIG. 14 is a cross-sectional view of a light emitting device package according to an example embodiment. In more detail, FIG. 14 is a light emitting device package in which a plurality of light emitting devices are connected to each other in series. A structure in which two light emitting devices are connected to each other in series is illustrated in FIG. 14, but the number of light emitting devices connected to each other in series is not limited to that of FIG. 14. FIG. 15 is a plan view of a light emitting device package according to an example embodiment. FIG. 16 is a rear view of a light emitting device package according to an example embodiment. FIG. 14 is a cross-sectional view taken along lines E-E' of FIGS. 15 and 16.

Referring to FIGS. 14 through 16, a light emitting device package according to an example embodiment may include light emitting stacks (S), first electrode structures 327 and second electrode structures 326 connected to the light emitting stacks (S), an insulating layer 330, a first metal pad 341 connected to the first electrode structure 327 of one of the light emitting stacks (S), a second metal pad 342 connected to a second electrode structure 326 of another of the light emitting stacks (S), an interconnecting portion 345 connecting the light emitting stacks (S) to each other in series, a first metal post 343 connected to the first metal pad 341, a second metal post 344 connected to the second metal pad 342, and a sealing portion 360. Because the light emitting device package illustrated in FIG. 14 has a structure fundamentally similar to that of the light emitting device package illustrated in FIG. 1, components other than the interconnecting portion 345 connecting the light emitting stack (S) in series will only briefly be described.

Each of the light emitting stacks (S) may include a first conductivity-type semiconductor layer 321, an active layer 322, and a second conductivity-type semiconductor layer 323. Each light emitting stack (S) may have a first surface provided by the first conductivity-type semiconductor layer 321, a second surface provided by the second conductivity-type semiconductor layer 323, the second surface opposing the first surface, and side surfaces positioned between the first and second surfaces. The first surface of the first conductivity-type semiconductor layer 321 may have an uneven pattern (P) formed thereon to improve light extraction efficiency. The first conductivity-type semiconductor layer 321, the active layer 322, and the second conductivity-type semiconductor layer 323 may include materials identical to those of the first conductivity-type semiconductor layer 121, the active layer 122, and the second conductivity-type semiconductor layer 123, respectively, of FIG. 1.

Each of the first electrode structures 327 may be disposed on a portion of the first surface of each light emitting stack (S) and connected to the first conductivity-type semiconductor layer 321. The first electrode structures 327 may be disposed to surround each of the light emitting stacks (S) along the edges of the first surfaces of the light emitting stacks (S). Each of the first electrode structures 327 may be disposed to cover a portion of an upper surface of the insulating layer 330 disposed adjacently to the first surface as well as to cover the edge of the first surface. The first electrode structures 327 may be separated from each other in regions between the light emitting stacks (S). The insulating layer 330 may be exposed between the first electrode structures 327 separated from each other. The first electrode structures 327 may include a material identical to that of the first electrode structure 127 of FIG. 1.

Each of the second electrode structures 326 may be disposed on the second surface of each light emitting stack (S), and connected to the second conductivity-type semiconductor layers 323, respectively. The second electrode structures 326 may cover a lower surface of the second conductivity-type semiconductor layer 323. In some example embodiments, the second electrode structures 326 may cover an entire lower surface of the second conductivity-type semiconductor layer 323. In other example embodiments, the second electrode structure 326 may cover a portion of the lower surface of the second conductivity-type semiconductor layer 323. The second electrode structures 326 may be reflective, and may include a material identical to that of the second electrode structure 126 of FIG. 1.

The sealing portion 360 may be disposed adjacently to the light emitting stacks (S). The sealing portion 360 may be disposed to surround the light emitting stacks (S), the first and second metal pads 341 and 342, the interconnecting portion 345, and the first and second metal posts 343 and 344. Lower surfaces of the first and second metal posts 343 and 344 may be exposed from the sealing portion 360. The first surface of the light emitting stack (S) may be exposed from the sealing portion 360. The sealing portion 360 may include a same material to that of the sealing portion 160 of FIG. 1.

The insulating layer 330 may be disposed between the light emitting stacks (S) and the sealing portion 360. In more detail, the insulating layer 330 may be disposed between the light emitting stacks (S) and the first and second metal pads 341 and 342, and between the light emitting stacks (S) and the interconnecting portion 345. The insulating layer 330 may also be disposed on the sealing portion 360 adjacent to the light emitting stack (S). The insulating layer 330 may include at least one first through hole (H1) at a side of each of the light emitting stacks (S). In some example embodiments, the insulating layer 330 may include first through holes (H1) separated from each other along the periphery of each of the light emitting stacks (S). The insulating layer 330 may include at least one second through hole (H2) on the second surface of each of the light emitting stacks (S). The insulating layer 330 may include a same material to that of the insulating layer 130 of FIG. 1. The numbers, arrangements, and shapes of the first through holes (H1) and the second through holes (H2) are not limited to those shown in FIGS. 14 through 16.

The first metal pad 341 may be disposed on a second surface of one of the light emitting stacks (S), and the second metal pad 342 may disposed on a second surface of the other thereof. The interconnecting portion 345 may be disposed between adjacent light emitting stacks (S). The first and second metal pads 341 and 342 may cover the side surfaces of the light emitting stacks (S) and extend adjacently to the first surfaces of the light emitting stacks (S). The first metal pad 341 may pass through the insulating layer 330 in a plurality of regions separated from each other to connect to the first electrode structure 327 of one of the light emitting stacks (S). For example, the first metal pad 341 may be connected to the first electrode structure 327 of one of the light emitting stacks (S) through the first through holes (H1) of the insulating layer 330. The second metal pad 342 may pass through the insulating layer 330 on the second surface of the other of the light emitting stacks (S) to connect to a second electrode structure 326. For example, the first metal pad 341 may be connected to the second electrode structure 326 through the second through holes (H2) of the insulating layer 330. The interconnecting portion 345 may connect a second electrode structure 326 of one of the light emitting stacks (S) to the first electrode structure 327 of the other of the light emitting stacks (S) through first through holes (H1) formed in a region between adjacent light emitting stacks (S) and second through holes (H2) formed on one of the light emitting stacks (S). The first metal pad 341, the interconnecting portion 345, and the second metal pad 342 may be disposed separately from each other so as to not be electrically connected. The first and second metal pads 341 and 345 and the interconnecting portion 345 may be formed of copper (Cu), but are not limited thereto, and may be formed of a conductive material other than Cu.

The first and second metal posts 343 and 344 respectively connected to the first and second metal pads 341 and 342 may be formed of a same material to that of the first and second metal pads 341 and 342. The first and second metal posts 343 and 344 may be connected to an external power source through the lower surfaces of the first and second metal posts 343 and 344 exposed from the sealing portion 360.

The light emitting device package may have a phosphor layer 370 on the first conductivity-type semiconductor layers 321 to convert at least a portion of the wavelength of light emitted by the active layers 322.

Figure 17:
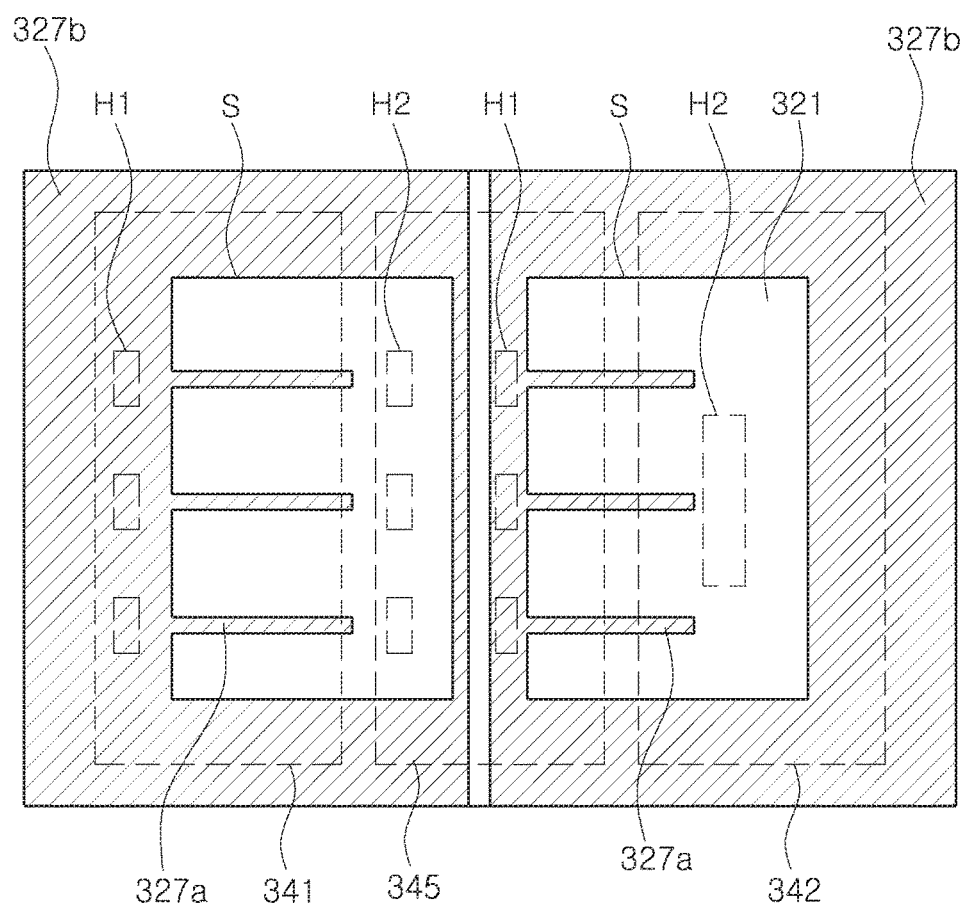
FIG. 17 is a plan view of a first electrode structure of a light emitting device package according to an example embodiment.

FIG. 17 is a plan view of a first electrode structure of a light emitting device package according to an example embodiment.

Referring to FIG. 17, first electrode structures 327*a* and 327*b* may be disposed on light emitting stacks (S), respectively. The first electrode structure 327*a* may include a plurality of electrode fingers extending from a side of each of first conductivity-type semiconductor layers 321. The first electrode structures 327*a* and 327*b* may be applied in a similar manner as the first electrode structures 127*a* and 127*b* of FIG. 4, and thus a repeated description thereof will be omitted for conciseness.

Figure 18:
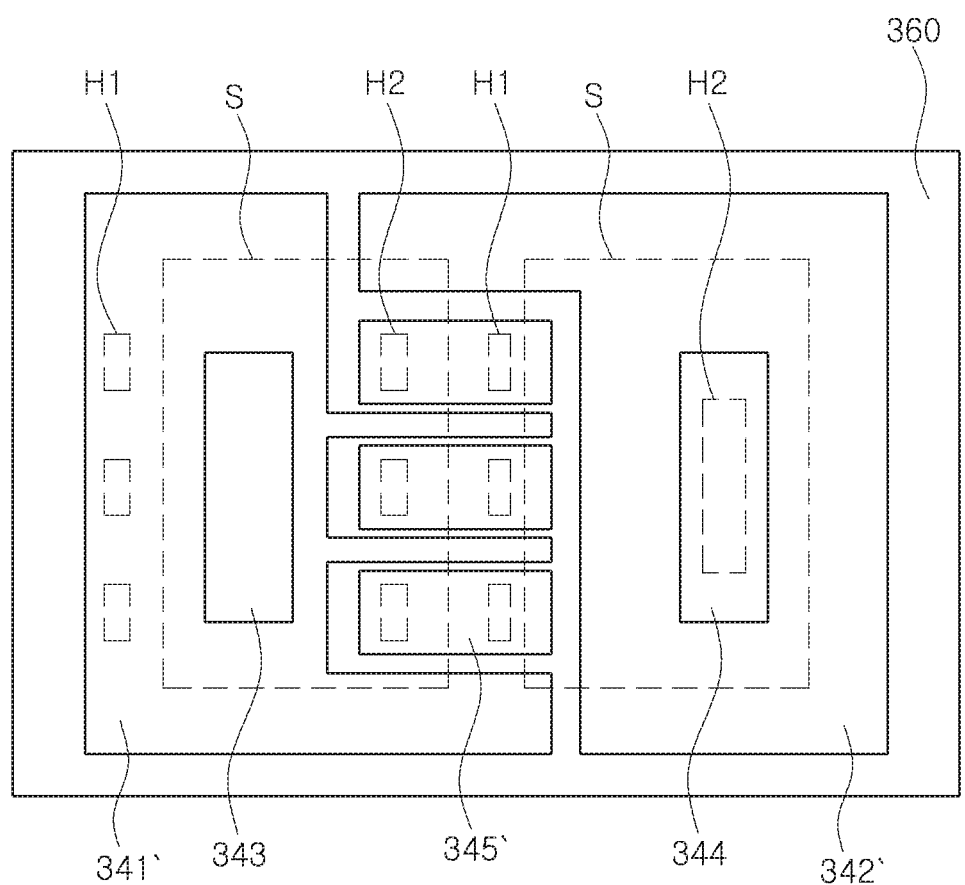
FIG. 18 is a rear view of metal pads of a light emitting device package according to an example embodiment.

FIG. 18 is a rear view of metal pads of a light emitting device package according to an example embodiment.

Referring to FIG. 18, interconnecting portions 345' may be disposed to be separated from each other in three regions, and a first metal pad 341' or a second metal pad 342' may be disposed to extend between the interconnecting portions 345'. The interconnecting portions 345' are not limited to those shown in FIG. 18, and may be modified in various forms according to arrangements of first through holes (H1) and second through holes (H2).

FIGS. 19A to 19E are cross-sectional views of a method of manufacturing a light emitting device package according to an example embodiment. Referring to FIGS. 19A to 19E, a method of manufacturing a light emitting device package in which a plurality of light emitting stacks (S) are connected to each other in series will hereinafter be described. Descriptions overlapping the method of manufacturing a light emitting device package described above with reference to FIGS. 13A to 13I will only briefly be provided.

Figure 19A:
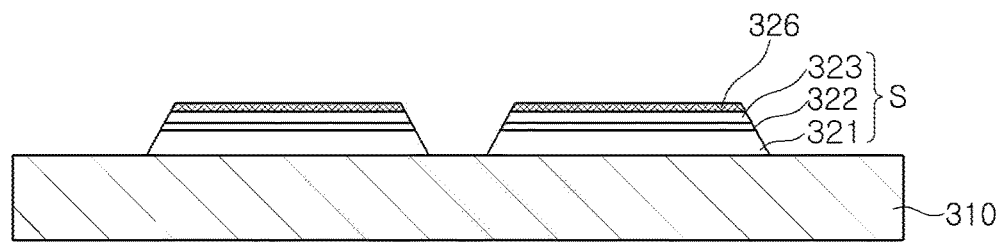
FIGS. 19A to 19E are cross-sectional views of a method of manufacturing a light emitting device package according to an example embodiment.

Referring to FIG. 19A, first, a first conductivity-type semiconductor layer 321, an active layer 322, and a second conductivity-type semiconductor layer 323 may be grown sequentially and epitaxially on a substrate 310.

Subsequently, a plurality of light emitting stacks (S) having a mesa structure may be formed by etching the first conductivity-type semiconductor layer 321, the active layer 322, and the second conductivity-type semiconductor layer 323 to certain sizes, respectively Next, a second electrode structure 326 may be formed on the second conductivity-type semiconductor layer 323 of each of the plurality of light emitting stacks (S). The second electrode structure 326 may cover an upper surface of the second conductivity-type semiconductor layer 323. In some example embodiments, the second electrode structure 326 may cover an entire upper surface of the second conductivity-type semiconductor layer 323. In other example embodiments, the second electrode structure 326 may cover a portion of the lower surface of the second conductivity-type semiconductor layer 323.

Figure 19B:
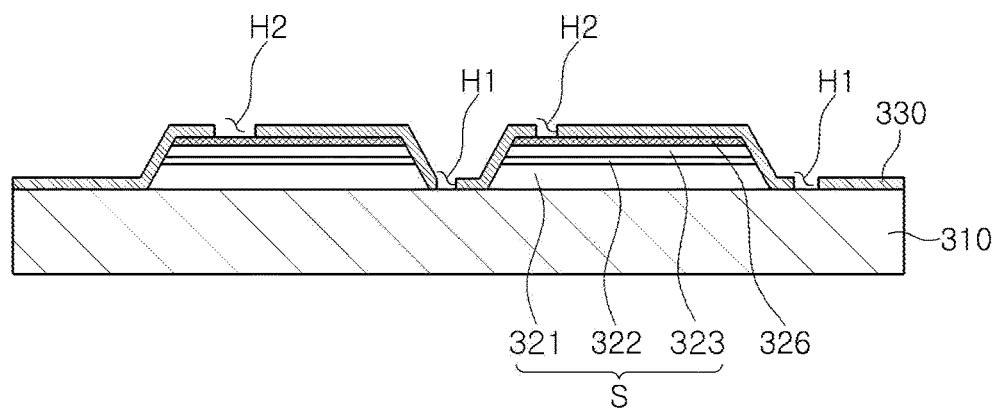

Next, referring to FIG. 19B, an insulating layer 330 having first through holes H1 and second through holes H2 may be formed.

The insulating layer 330 may be formed on the substrate 310 to cover the light emitting stacks (S), and portions of the insulating layer 330 may then be etched using a photoresist pattern as a mask, and the a plurality of first through holes H1 exposing the substrate 310 at the periphery of the light emitting stacks (S) and a plurality of second through holes (H2) respectively exposing the second electrode structures 326 may thus be formed. A plurality of first through holes (H1) may be formed in the periphery of the light emitting stacks (S). A plurality of first through holes (H1) may also be formed between the light emitting stacks (S).

Figure 19C:
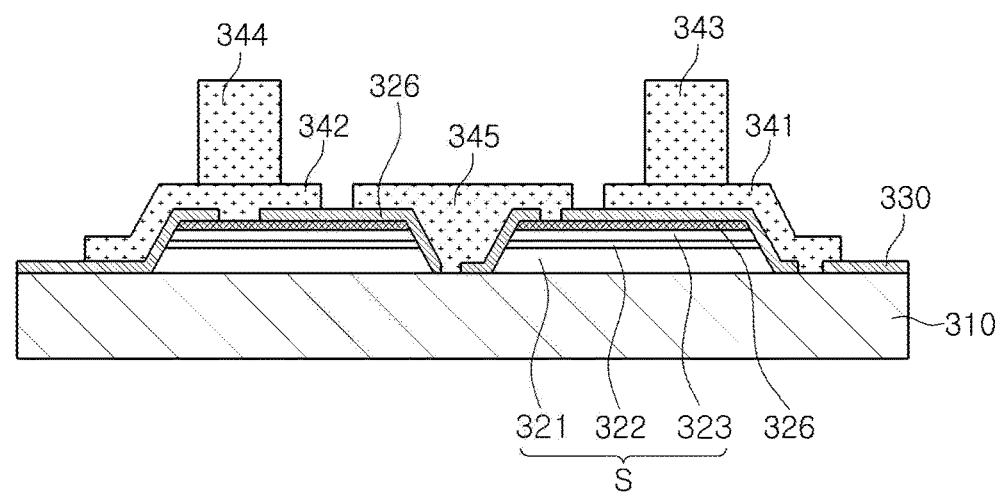

Next, referring to FIG. 19C, a first metal pad 341, a second metal pad 342, and an interconnecting portion 345 may be formed on the insulating layer 330, and a first metal post 343 and a second metal post 344 may then be formed on the first metal pad 341 and the second metal pad 342, respectively.

The first metal pad 341, the interconnecting portion 345, and the second metal pad 342 may be formed by a plating process. The interconnecting portion 345 may be formed between the light emitting stacks (S), and thus the light emitting stacks (S) may be electrically connected to each other in series. The interconnecting portion 345 may simultaneously fill first through holes (H1) formed in a region between the light emitting stacks (S) and a second through hole (H2) formed on one of the light emitting stacks (S).

The first metal pad 341 may fill first through holes (H1) formed in the periphery of one of the light emitting stacks (S), and the second metal pad 342 may fill second through holes (H2) formed on the remainder of the light emitting stacks (S).

The first metal pad 341, the interconnecting portion 345, and the second metal pad 342 may be spaced apart from each other so as to not be electrically connected.

Subsequently, the first metal post 343 connected to the first metal pad 341 and the second metal post 344 connected to the second metal pad 342 may be formed by a plating process.

Figure 19D:
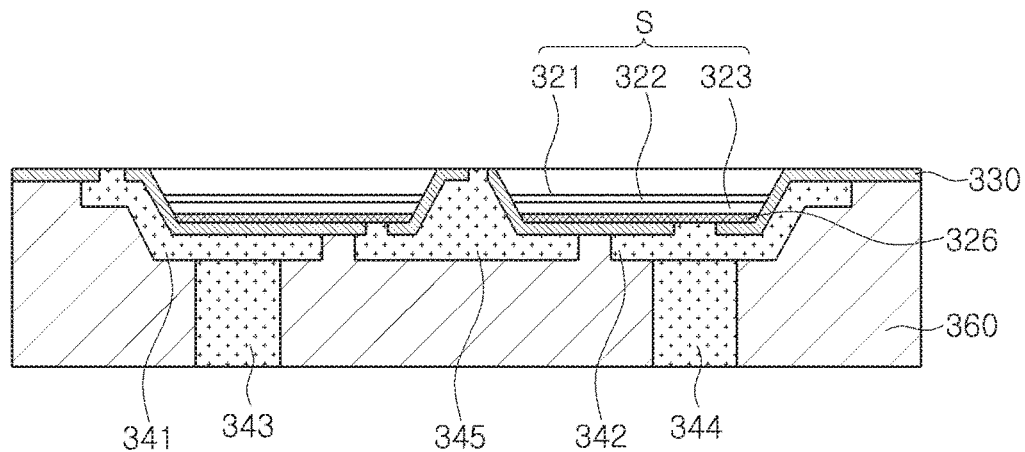

Referring to FIG. 19D, a sealing portion 360 encapsulating the first and second metal pads 342 and 345, the interconnecting portion 345, and the first and second metal posts 343 and 344 may be formed. Next, the substrate 310 may be removed using a process such as grinding or laser lift-off. After the removal of the substrate 310, an uneven pattern (P) may be formed on an upper surface of each of the first conductivity-type semiconductor layers 321 to improve light emission efficiency.

Figure 19E:
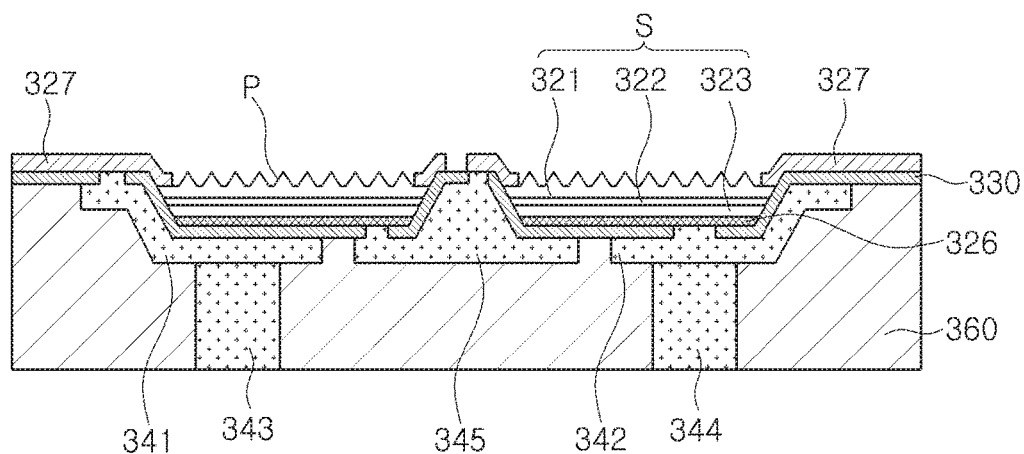

Next, referring to FIG. 19E, first electrode structures 327 may be formed on the first conductivity-type semiconductor layers 321, respectively.

A conductive material may be deposited on the first conductivity-type semiconductor layers 321, the conductive material may then be etched using a photoresist pattern as a mask, and the first electrode structure 327 disposed on the edges of each of the first conductivity-type semiconductor layers 321 may thus be formed. Each of the first electrode structures 327 may cover the upper surface of the insulating layer 330 along the periphery of each of the light emitting stacks (S).

Next, a phosphor layer 370 may be formed on the light emitting stacks (S), a process cutting individual packages may be finally performed, and the light emitting device package illustrated in FIG. 14 may thus be formed. The phosphor layer 370 may also be formed on the insulating layer 330.

A light source module, a backlight device, a lighting device, and the like using a light emitting device package according to an example embodiment will hereinafter be described.

Figures 20A, 20B:
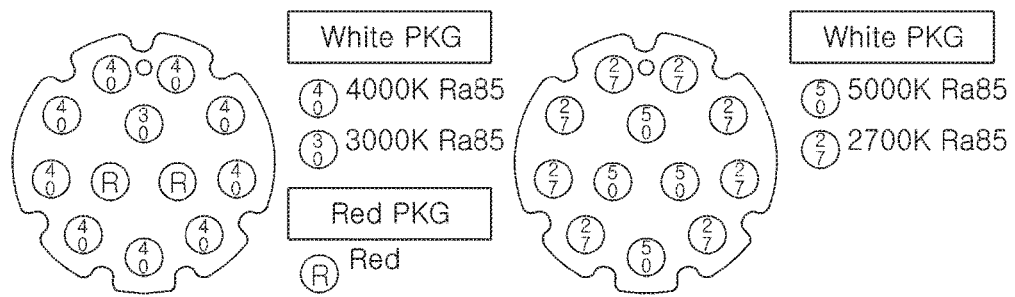
FIGS. 20A and 20B are schematic views of white light source modules including a light emitting device package according to an example embodiment.

FIGS. 20A and 20B are schematic views of white light source modules including a light emitting device package according to an example embodiment, respectively.

Referring to FIGS. 20A and 20B, each of the white light source modules may include a plurality of light emitting device packages mounted on a circuit board. The plurality of light emitting device packages mounted in a single white light source module may be configured of a same kind of package generating light having an identical wavelength, but as in the present example embodiment, may also be configured of different kinds of packages generating light having different wavelengths.

Referring to FIG. 20A, the white light source module may be configured by combining a white light emitting device package having a color temperature of 4,000K, and a white light emitting device package and a red light emitting device package having a color temperature of 3,000K. The white light source module may provide white light having a color temperature in a range of 3,000 to 4,000K and a color rendering index in a range of 85 to 100 Ra.

Referring to FIG. 20B, the white light source module may only be configured of white light emitting device packages, and a portion thereof may emit white light having different color temperatures. For example, a combination of a white light emitting device package having a color temperature of 2,700K and a white light emitting device package having a color temperature of 5,000K may allow white light having a color temperature in a range of 2,700 to 5,000K and a color rendering index in a range of 85 to 99 Ra to be emitted.

Here, the number of light emitting device packages having respective color temperatures may vary mostly depending on default color temperature settings. For example, if a lighting device has a default color temperature setting adjacent to 4,000K, the white light source module may include light emitting device packages having a color temperature of 4,000K more than light emitting device packages or red light emitting device packages having a color temperature of 3,000K.

As such, the different kinds of light emitting device packages may include at least one of a light emitting device in which a blue light emitting device is combined with a yellow, green, red, or orange phosphor to emit white light, or a violet, blue, green, red, or infrared light emitting device, thereby adjusting a color temperature and a color rendering index (CRI) of white light.

Figure 26:
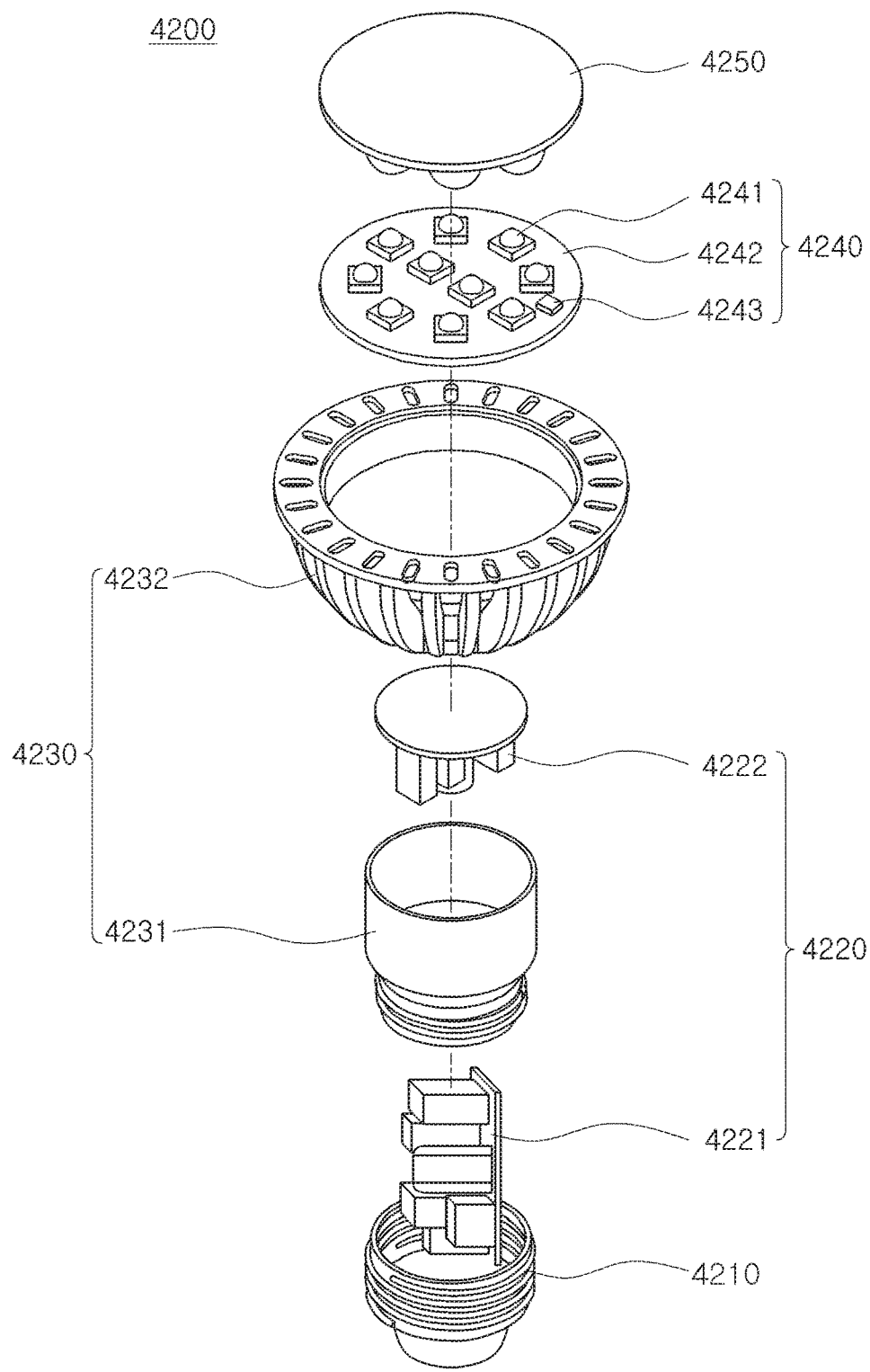
FIG. 26 is an exploded perspective view of a bulb-type lamp including a light emitting device package according to an example embodiment.

The above-mentioned white light source module may also be used as a light source module 4240 of a bulb-type lighting device (refer to FIG. 26).

In a single light emitting device package, light having a desired color may be determined according to wavelengths of an LED chip as a light emitting device and types and mixing ratios of phosphors. In a case of a white light emitting device package, a color temperature and a CRI may be adjusted thereby.

For example, when the LED chip emits blue light, a light emitting device package including at least one of yellow, green, and red phosphors may emit white light having a variety of color temperatures according to mixing ratios of the at least one phosphor. Conversely, a light emitting device package in which a green or red phosphor is applied to a blue LED chip may emit green or red light. As such, a combination of a light emitting device package emitting white light and a light emitting device package emitting green or red light may allow a color temperature and a color rendering index of white light to be adjusted. In addition, the single light emitting device package may include at least one of light emitting devices emitting violet, blue, green, red or infrared light.

In this case, the lighting device may adjust a color rendering index to range from the level of white light emitted by a sodium lamp to the level of sunlight, and may emit various types of white light having a color temperature in a range of 2,000K to 20,000K. If necessary, the lighting device may emit purple, blue, green, red, and orange visible light or infrared light to adjust lighting color according to the lighting device's surroundings or a user's mood. The lighting device may also emit light having a certain wavelength that is able to promote plant growth.

Figure 21:
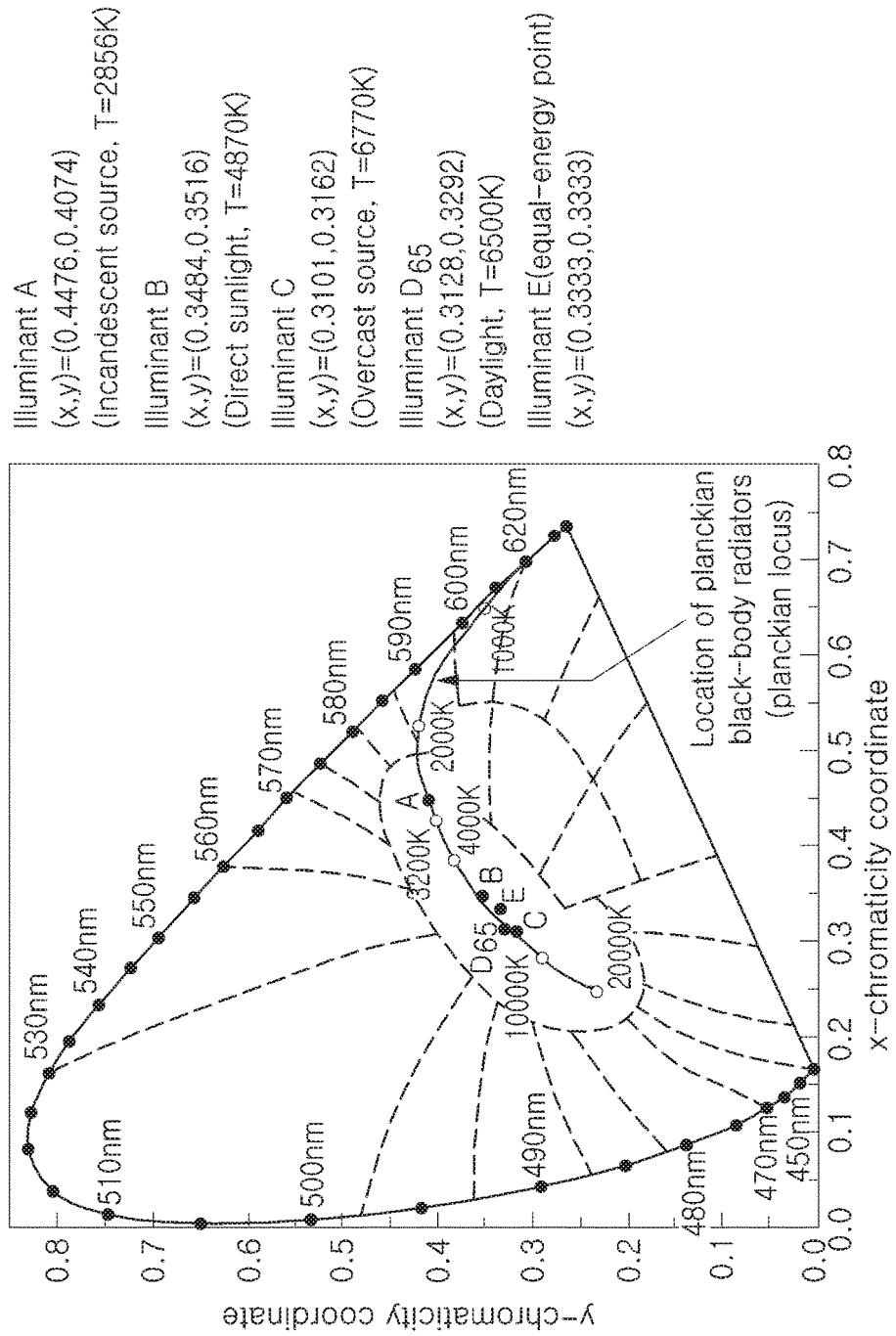
FIG. 21 is a CIE 1931 color space chromaticity diagram illustrating a wavelength conversion material employable in a light emitting device package according to an example embodiment.

FIG. 21 is a CIE 1931 color space chromaticity diagram illustrating a wavelength conversion material employable in a semiconductor light emitting device package or a light emitting device package according to an example embodiment.

Referring to the CIE 1931 color space chromaticity diagram illustrated in FIG. 21, white light generated by combining yellow, green, and red phosphors with a blue light emitting device, or a green light emitting device and a red light emitting device with a blue light emitting device may have two or more peak wavelengths, and (x, y) coordinates of the CIE 1931 color space chromaticity diagram may be located in an area of segments connecting coordinates: (0.4476, 0.4074), (0.3484, 0.3516), (0.3101, 0.3162), (0.3128, 0.3292), and (0.3333, 0.3333). Alternatively, (x, y) coordinates may be located in an area surrounded by the segments and a blackbody radiation spectrum. A color temperature of white light may range from 2,000K to 20,000K. In FIG. 21, white light adjacent to Point E (0.3333, 0.3333) below the blackbody radiation spectrum may be used as a light source for lighting to create clearer viewing conditions to the naked eye with light having a yellow-based component reduced. Thus, a lighting product using white light in the vicinity of Point E (0.3333, 0.3333) below the blackbody radiation spectrum may be useful as lighting for a retail space in which consumer goods are sold.

Various types of materials such as a phosphor and a quantum dot may be used as a material converting the wavelength of light emitted by a semiconductor light emitting device.

Phosphors may have the following empirical formulas and colors:

Oxide-based phosphor: yellow and green $Y_3Al_5O_{12}$:Ce, $Tb_3Al_5O_{12}$:Ce, and $Lu_3Al_5O_{12}$:Ce Silicate-based phosphor: yellow and green $(Ba,Sr)_2SiO_4$:Eu, and yellow and orange $(Ba,Sr)_3SiO_5$:Ce Nitride-based phosphor: green β-SiAlON:Eu, yellow $La_3Si_6N_{11}$:Ce, orange α-SiAlON:Eu, and red $CaAlSiN_3$:Eu, $Sr_2Si_5N_8$:Eu, $SrSiAl_4N_7$:Eu, $SrLiAl_3N_4$:Eu, and $Ln_{4-x}(Eu_zM_{1-z})_xSi_{12-y}Al_yO_{3+x+y}N_{18-x-y}$ (0.5≤x≤3, 0<z<0.3, 0<y≤4)—formula 1

In formula 1, Ln may be at least an element selected from a group consisting of a IIIa-based element and a rare-earth element, and M may be at least one element selected from a group consisting of Ca, Ba, Sr, and Mg.

Fluoride-based phosphor: KSF-based red $K_2SiF_6$:$Mn^{4+}$, $K_2TiF_6$:$Mn^{4+}$, $NaYF_4$:$Mn^{4+}$, and $NaGdF_4$:$Mn^{4+}$ (For example, a composition ratio of the Mn may be 0<z≤0.17).

A phosphor composition may be used to conform with stoichiometry, and respective elements thereof may be replaced by other elements in each group on the periodic table. For example, Sr may be substituted by Ba, Ca, Mg, and the like of alkaline earth (group II), and Y may be replaced by Tb, Lu, Sc, Gd, and the like of lanthanides. Eu or the like, an activator, may be substituted by Ce, Tb, Pr, Er, Yb, and the like according to required energy levels. An activator may only be applied to the phosphor composition, or an additional sub activator or the like may be applied to the phosphor composition to modify characteristics thereof.

In particular, the fluoride-based red phosphors may be coated with a fluoride not containing Mn, respectively, or may further include an organic coat on a surface of each of the fluoride-based red phosphors or on a surface of each of the fluoride-based red phosphors coated with the fluoride not containing Mn, in order to improve reliability at high temperatures and high humidity. In the case of the fluoride-based red phosphors described above, because a narrow full width at half maximum (FWHM) less than or equal to 40 nm may be implemented unlike other phosphors, the fluoride-based red phosphors may be used for a high-resolution television, such as an ultra-high definition (UHD) television.

Table 1 below indicates types of phosphors for applications of a white light emitting device using a blue LED chip (440 nm to 460 nm) and an UV LED chip (380 nm to 430 nm).

TABLE 1

| Use | Phosphor |
| --- | --- |
| LED TV BLU | β-SiAlON:$Eu^{2+}$, (Ca, Sr)AlSiN$_3$:$Eu^{2+}$, La$_3$Si$_6$N$_{11}$:$Ce^{3+}$, K$_2$SiF$_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$(0.5 ≤ x ≤ 3, 0 < z < 0.3, 0 < y ≤ 4), K$_2$TiF$_6$:$Mn^{4+}$, NaYF$_4$:$Mn^{4+}$, NaGdF$_4$:$Mn^{4+}$, K$_3$SiF$_7$:$Mn^{4+}$ |

TABLE 1-continued

| Use | Phosphor |
|---|---|
| Lighting | $Lu_3Al_5O_{12}:Ce^{3+}$, $Ca\text{-}\alpha\text{-}SiAlON:Eu^{2+}$, $La_3Si_6N_{11}:Ce^{3+}$, $(Ca, Sr)AlSiN_3:Eu^{2+}$, $Y_3Al_5O_{12}:Ce^{3+}$, $K_2SiF_6:Mn^{4+}$, $SrLiAl_3N_4:Eu$, $Ln_{4-x}(Eu_zM_{1-z})_xSi_{12-y}Al_yO_{3+x+y}N_{18-x-y}$ ($0.5 \leq x \leq 3$, $0 < z < 0.3$, $0 < y \leq 4$), $K_2TiF_6:Mn^{4+}$, $NaYF_4:Mn^{4+}$, $NaGdF_4:Mn^{4+}$, $K_3SiF_7:Mn^{4+}$ |
| Side View (Mobile, Laptop) | $Lu_3Al_5O_{12}:Ce^{3+}$, $Ca\text{-}\alpha\text{-}SiAlON:Eu^{2+}$, $La_3Si_6N_{11}:Ce^{3+}$, $(Ca, Sr)AlSiN_3:Eu^{2+}$, $Y_3Al_5O_{12}:Ce^{3+}$, $(Sr, Ba, Ca, Mg)_2SiO_4:Eu^{2+}$, $K_2SiF_6:Mn^{4+}$, $SrLiAl_3N_4:Eu$, $Ln_{4-x}(Eu_zM_{1-z})_xSi_{12-y}Al_yO_{3+x+y}N_{18-x-y}$ ($0.5 \leq x \leq 3$, $0 < z < 0.3$, $0 < y \leq 4$), $K_2TiF_6:Mn^{4+}$, $NaYF_4:Mn^{4+}$, $NaGdF_4:Mn^{4+}$, $K_3SiF_7:Mn^{4+}$ |
| Electronic device (Head Lamp, etc.) | $Lu_3Al_5O_{12}:Ce^{3+}$, $Ca\text{-}\alpha\text{-}SiAlON:Eu^{2+}$, $La_3Si_6N_{11}:Ce^{3+}$, $(Ca, Sr)AlSiN_3:Eu^{2+}$, $Y_3Al_5O_{12}:Ce^{3+}$, $K_2SiF_6:Mn^{4+}$, $SrLiAl_3N_4:Eu$, $Ln_{4-x}(Eu_zM_{1-z})_xSi_{12-y}Al_yO_{3+x+y}N_{18-x-y}$ ($0.5 \leq x \leq 3$, $0 < z < 0.3$, $0 < y \leq 4$), $K_2TiF_6:Mn^{4+}$, $NaYF_4:Mn^{4+}$, $NaGdF_4:Mn^{4+}$, $K_3SiF_7:Mn^{4+}$ |

In addition, a wavelength converter may be formed using a wavelength conversion material such as a quantum dot (QD), which may be used to replace a phosphor or may be mixed with a phosphor.

Figure 22:
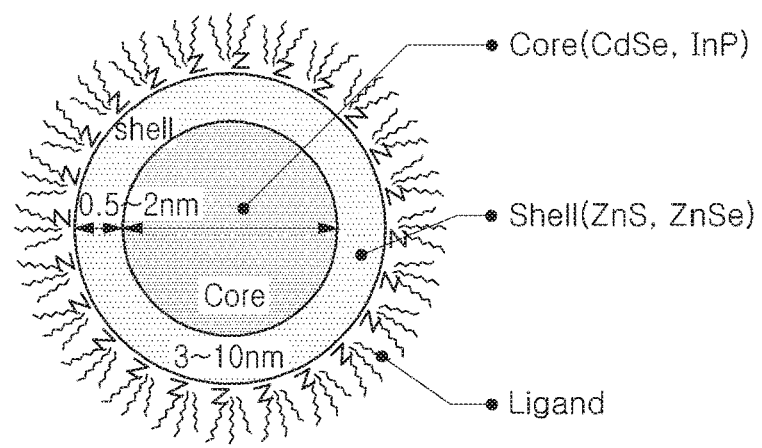
FIG. 22 is a cross-sectional view of a quantum dot employable in a light emitting device package according to an example embodiment.

FIG. 22 is a cross-sectional view of a quantum dot employable in a semiconductor light emitting device package or a light emitting device package according to an example embodiment.

Referring to FIG. 22, a quantum dot (QD) may have a core-shell structure including a Group II-VI or Group III-V compound semiconductor. For example, the QD may have a core such as CdSe, InP, and the like, and a shell such as ZnS, ZnSe, and the like. The QD may also include a ligand stabilizing the core and the shell. For example, a diameter of the core may range from 1 nm to 30 nm, and further from 3 to 10 nm, and a thickness of the shell may range from 0.1 nm to 20 nm, and further from 0.5 nm to 2 nm.

The QD may implement various colors according to sizes thereof, and in particular, when used as a phosphor alternative, may be used as a red or green phosphor. In the case of using the QD, a narrow full width at half maximum (FWHM) (for example, about 35 nm) thereof may be implemented.

The wavelength conversion material may be implemented in a form contained in an encapsulant. Conversely, the wavelength conversion material may be previously manufactured in the form of a film, and may be attached to a surface of an optical structure, such as an LED chip or a light guide plate, for use. In this case, the wavelength conversion material may be readily applied to a required region of a structure having a uniform thickness.

Figure 23:
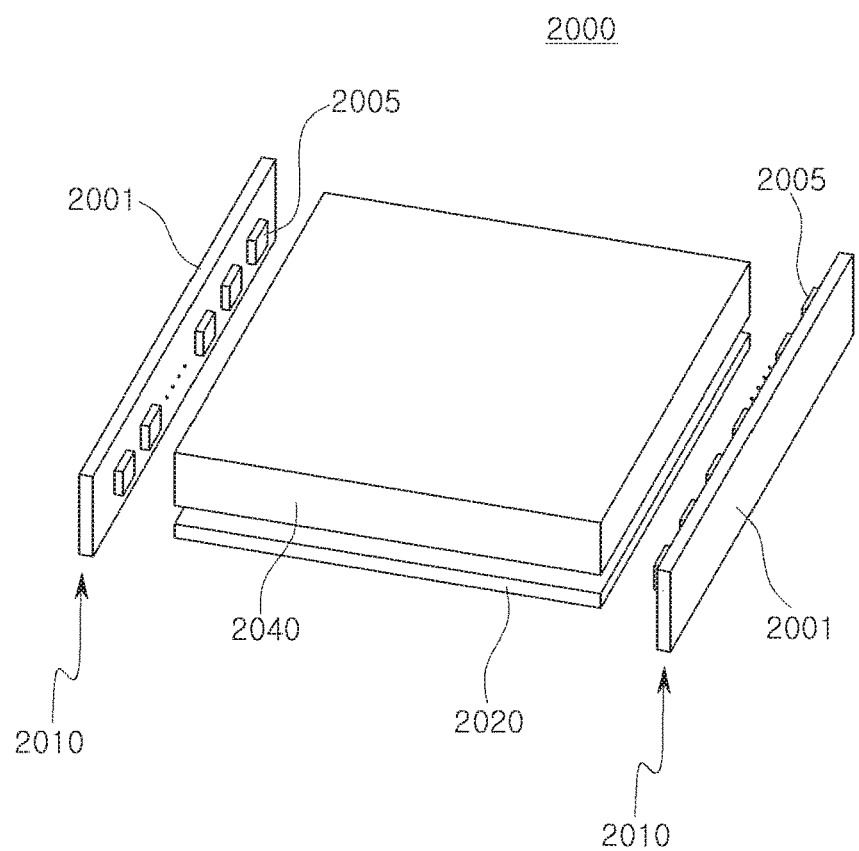
FIG. 23 is a perspective view of a backlight device including a light emitting device package according to an example embodiment.

FIG. 23 is a perspective view of a backlight device including a light emitting device package according to an example embodiment.

Referring to FIG. 23, a backlight device 2000 may include a light guide plate 2040, and light source modules 2010 provided on opposing side surfaces thereof, respectively. The backlight device 2000 may also further include a reflective plate 2020 disposed below the light guide plate 2040. The backlight device 2000 according to the present example embodiment may be an edge type.

According to an example embodiment, each of the light source modules 2010 may only be provided on a side surface of the light guide plate 2040, or additionally on another side surface thereof. Each of the light source modules 2010 may include a printed circuit board (PCB) 2001 and a plurality of light sources 2005 disposed on an upper surface of the PCB 2001. Here, the light sources 2005 may include a light emitting device package according to an example embodiment.

Figure 24:
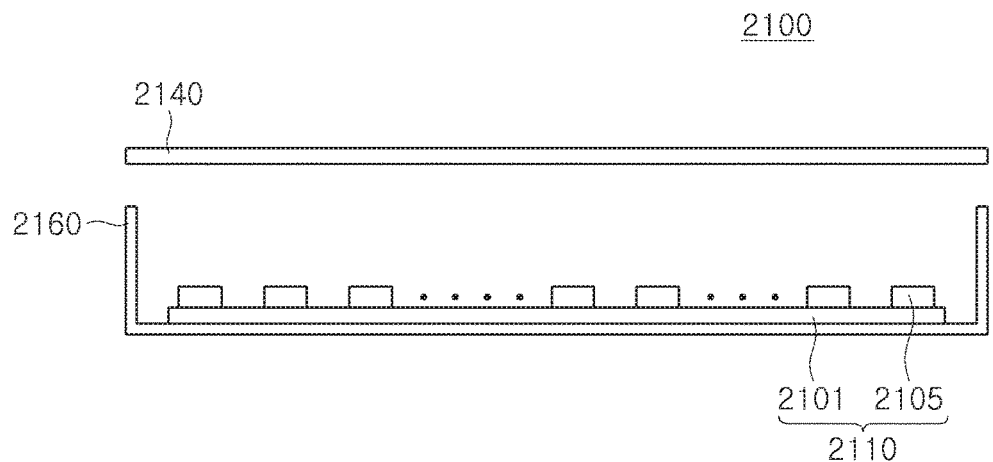
FIG. 24 is a cross-sectional view of a direct-type backlight device including a light emitting device package according to an example embodiment.

FIG. 24 is a cross-sectional view of a direct-type backlight device including a light emitting device package according to an example embodiment.

Referring to FIG. 24, a backlight device 2100 may include a light diffusion plate 2140 and a light source module 2110 disposed below the light diffusion plate 2140. The backlight device 2100 may also further include a bottom case 2160 disposed below the light diffusion plate 2140 and accommodating the light source module 2110. The backlight device 2100 according to the present example embodiment may be a direct type.

The light source module 2110 may include a printed circuit board (PCB) 2101 and a plurality of light sources 2105 disposed on an upper surface of the PCB 2101. Here, the light sources 2105 may include a light emitting device package according to one of the above-described example embodiments.

Figure 25:
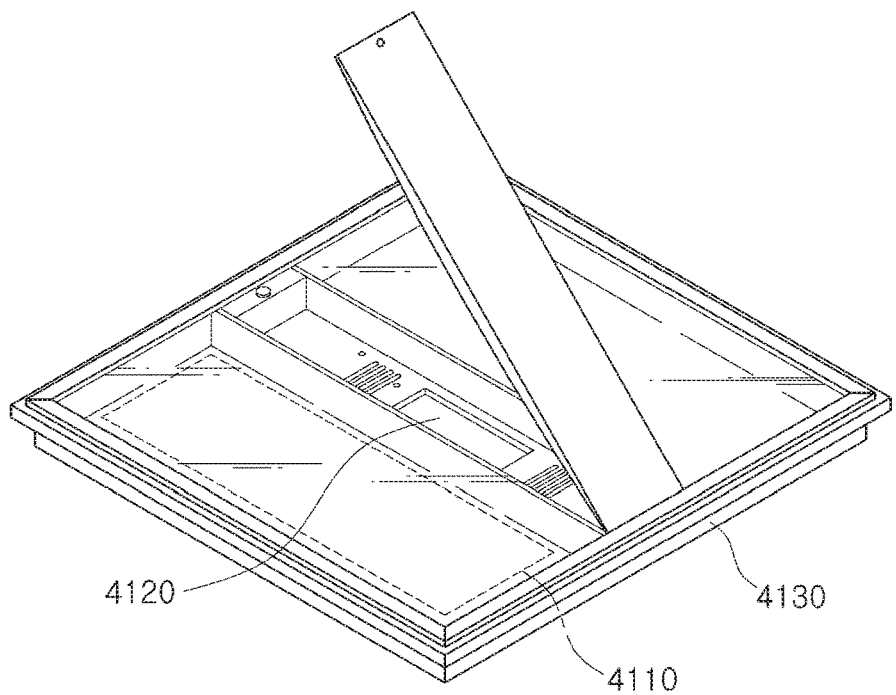
FIG. 25 is a perspective view of a flat panel lighting device including a light emitting device package according to an example embodiment.

FIG. 25 is a perspective view of a flat panel lighting device including a light emitting device package according to an example embodiment.

Referring to FIG. 25, a flat panel lighting apparatus 4100 may include a light source module 4110, a power supply 4120, and a housing 4130. According to an example embodiment, the light source module 4110 may include a light emitting device array as a light source, and the power supply 4120 may include a light emitting device driver.

The light source module 4110 may include the light emitting device array, and may have an overall flat shape. The light emitting device array may include a light emitting device and a controller storing driving information of the light emitting device. The light emitting device may be provided as a light emitting device package according to one of the above-described example embodiments.

The power supply 4120 may be configured to supply power to the light source module 4110. The housing 4130 may have a housing space to receive the light source module 4110 and the power supply 4120, and may have a hexahedral shape with an open side surface thereof, but is not limited thereto. The light source module 4110 may be disposed to emit light to the open side surface of the housing 4130.

FIG. 26 is an exploded perspective view of a lamp including a light emitting device package according to an example embodiment.

Referring to FIG. 26, a lighting apparatus 4200 may include a socket 4210, a power supply 4220, a heat sink 4230, a light source module 4240, and an optical unit 4250. The light source module 4240 may include a light emitting device array, and the power supply 4220 may include a light emitting device driver.

The socket 4210 may be configured to replace that of a conventional lighting device. Power supplied to the lighting device 4200 may be applied through the socket 4210. As illustrated in FIG. 26, the power supply 4220 may be attached with a first power supply unit 4221 and a second power supply unit 4222. The heat sink 4230 may include an internal heat sink 4231 and an external heat sink 4232. The internal heat sink 4231 may be directly connected to the light source module 4240 and/or the power supply 4220. This may allow heat to be transferred to the external heat sink 4232. The optical unit 4250 may include an internal optical portion (not shown) and an external optical portion (not shown), and may be configured to evenly scatter light emitted by the light source module 4240.

The light source module 4240 may receive power from the power supply 4220 to emit light to the optical unit 4250. The light source module 4240 may include at least one light source 4241, a circuit board 4242, and a controller 4243, and the controller 4243 may store driving information of the at least one light source 4241. Here, the at least one light source 4241 may be provided as a light emitting device package according to one of the above-described example embodiments.

Figure 27:
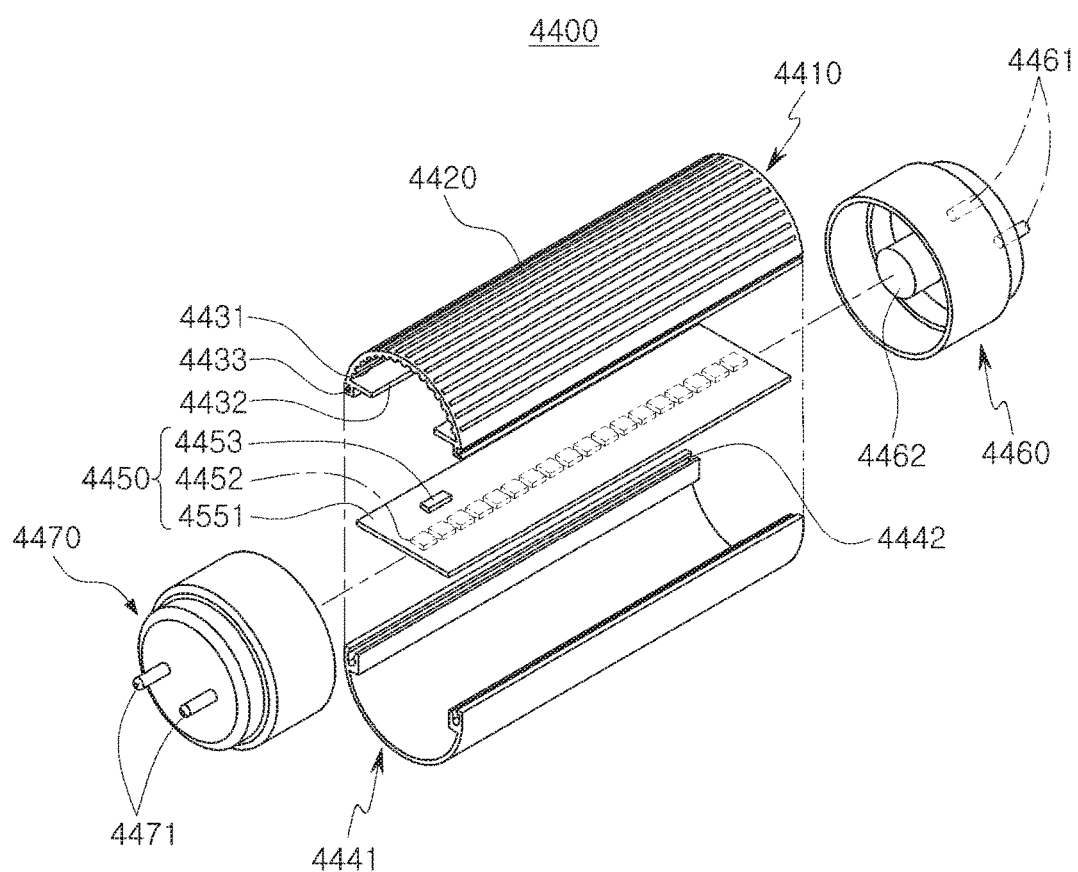
FIG. 27 is an exploded perspective view of a bar-type lamp including a light emitting device package according to an example embodiment.

FIG. 27 is an exploded perspective view of a bar-type lamp including a light emitting device package according to an example embodiment.

Referring to FIG. 27, a lighting apparatus 4400 may include a heat sink 4410, a cover 4441, a light source module 4450, a first socket 4460 and a second socket 4470. A plurality of heat dissipation fins 4420 and 4431 may be formed on internal or/and external surfaces of the heat sink 4410 to have uneven shapes, and may be designed to have various shapes and intervals. The heat sink 4410 may have protruding supports 4432 respectively formed on insides thereof. The protruding supports 4432 may be fixed to the light source module 4450. The heat sink 4410 may have protrusions 4433 respectively formed on opposing ends thereof.

The cover 4441 may have grooves 4442 formed therein, and the protrusions 4433 of the heat sink 4410 may be coupled to the grooves 4442 by a hook coupling structure, respectively. Locations of the grooves 4442 and the protrusions 4433 may be reversed with each other.

The light source module 4450 may include a light emitting device array. The light source module 4450 may include a printed circuit board (PCB) 4451, light sources 4452, and a controller 4453. The controller 4453 may store driving information of the light sources 4452. The PCB 4451 may have circuit lines formed thereon to operate the light sources 4452. The PCB 4451 may also include components operating the light sources 4452. The light sources 4452 may include a light emitting device package according to an example embodiment.

The first and second sockets 4460 and 4470 as a pair of sockets may have a structure in which the first and second sockets 4460 and 4470 are coupled to opposing ends of a cylindrical cover unit configured of the heat sink 4410 and the cover 4441, respectively. For example, the first socket 4460 may include electrode terminals 4461 and a power supply 4462, and the second socket 4470 may include dummy terminals 4471 disposed thereon. In addition, one of the first and second sockets 4460 and 4470 may have an optical sensor and/or a communications module built therein. For example, the second socket 4470 with the dummy terminals 4471 disposed thereon may have an optical sensor and/or a communications module built therein. As another example, the first socket 4460 with the electrode terminals 4461 disposed thereon may have an optical sensor and/or a communications module built therein.

Figure 28:
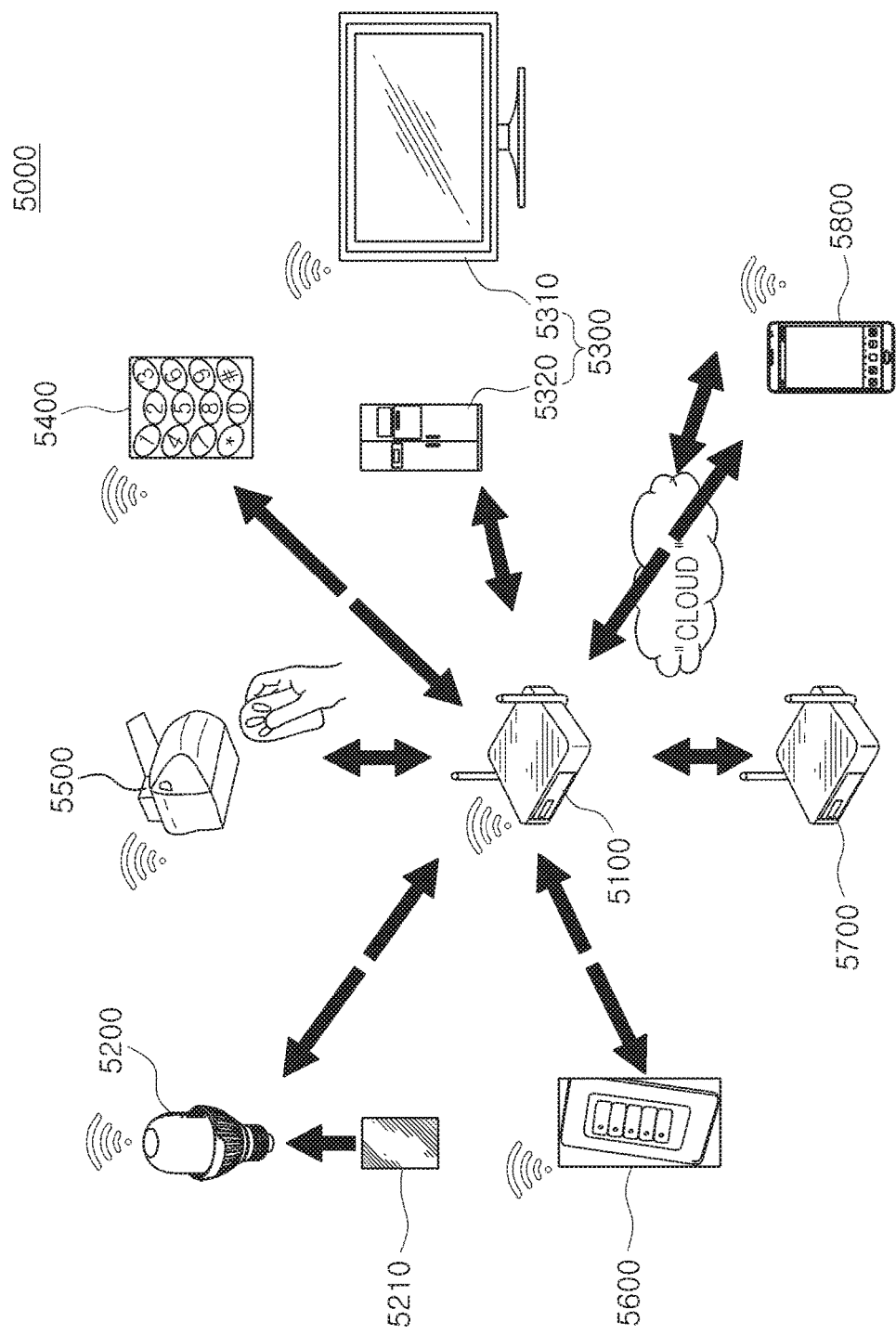
FIG. 28 is a schematic view of an indoor lighting control network system including a light emitting device package according to an example embodiment.

FIG. 28 is a schematic view of an indoor lighting control network system including a light emitting device package according to an example embodiment.

Referring to FIG. 28, a network system 5000 according to an example embodiment may be a complex smart lighting-network system in which lighting technology, Internet of Things (IoT) technology, wireless communications technology, and the like using a light emitting device, such as an LED, converge. The network system 5000 may be implemented using various types of lighting devices and wired and wireless communications devices, and may be realized by a sensor, a controller, a communications module, software for network control and maintenance, and the like.

The network system 5000 may be applied to an open space, such as a park or street, as well as a closed space defined within a building, such as a home or an office. The network system 5000 may be implemented on the basis of an IoT environment to collect and process various pieces of information and provide the collected and processed information to a user. In this case, an LED lamp 5200 included in the network system 5000 may function to check and control operational states of other devices 5300 to 5800 included in the IoT environment on the basis of a function of the LED lamp 5200, such as visible light communications, as well as to receive information about surroundings from a gateway 5100 to control lighting of the LED lamp 5200 itself.

Referring to FIG. 28, the network system 5000 may include the gateway 5100 processing data transmitted and received according to different communications protocols, the LED lamp 5200 connected to the gateway 5100 to communicate therewith and including an LED, and the plurality of devices 5300 to 5800 connected to the gateway 5100 to communicate therewith according to various wireless communications schemes. In order to implement the network system 5000 on the basis of the IoT environment, the respective devices 5300 to 5800 including the LED lamp 5200 may include at least one communications module. According to an example embodiment, the LED lamp 5200 may be connected to the gateway 5100 to communicate therewith by wireless communications protocols, such as Wi-Fi, Zigbee®, and light fidelity (Li-Fi). To this end, the LED lamp 5200 may have at least one communications module 5210 for a lamp. The LED lamp 5200 may include a light emitting device package according to example embodiments.

As described above, the network system 5000 may be applied to an open space, such as a park or a street, as well as a closed space, such as a home or an office. When the network system 5000 is applied to a home, the plurality of devices 5300 to 5800 included in the network system 5000 and connected to the gateway 5100 to communicate therewith on the basis of IoT technology may include home appliances 5300, such as a television 5310 or a refrigerator 5320, a digital door lock 5400, a garage door lock 5500, a lighting switch 5600 installed on a wall or the like, a router 5700 for wireless communications network relay, and a mobile device 5800, such as a smartphone, a tablet PC, or a laptop personal computer (PC).

In the network system 5000, the LED lamp 5200 may check the operational states of the various types of devices 5300 to 5800 or may automatically control the luminance of the LED lamp 5200 itself according to surroundings and circumstances using wireless communications networks (Zigbee®, Wi-Fi, Li-Fi, and the like) installed in a home. Use of Li-Fi communications using visible light emitted by the LED lamp 5200 may allow the devices 5300 to 5800 included in the network system 5000 to be controlled.

First, the LED lamp 5200 may automatically control the luminance of the LED lamp 5200 on the basis of surrounding information transmitted from the gateway 5100 through the communications module for a lamp 5210, or surrounding information collected by a sensor mounted to the LED lamp 5200. For example, the brightness of the LED lamp 5200 may be automatically controlled according to a type of a program being broadcast on the television 5310 or the brightness of an image. To this end, the LED lamp 5200 may receive operational information of the television 5310 from the communications module for a lamp 5210 connected to the gateway 5100. The communications module for a lamp 5210 may be integrally modularized with a sensor and/or a controller included in the LED lamp 5200.

For example, in a case in which a program broadcast on TV is a drama, a color temperature of illumination may be controlled to be less than or equal to 12,000K, such as 5,000K, according to predetermined settings to control colors, thereby creating a cozy atmosphere. In a different manner, when a program is a comedy, the network system 5000 may be configured in such a manner that a color temperature of illumination is increased to 5,000K or more and to be blue-based white lighting according to predetermined settings.

When a certain period of time passes after the digital door lock 5400 is locked while there is no person in a home, the network system 5000 may allow all LED lamps 5200 turned on to be turned off, thereby preventing a waste of electricity. Alternatively, when a security mode is set by the mobile device 5800 or the like, if the digital door lock 5400 is locked while there is no person in a home, the network system 5000 may allow the LED lamps 5200 to be kept turned on.

Operations of the LED lamp 5200 may be controlled according to surrounding information collected by various types of sensors connected to the network system 5000. For example, when the network system 5000 is implemented in a building, a light, a position sensor, and a communications module may be combined with each other in the building to collect information on locations of people in the building so that the light may be turned on or off, or the collected information may be provided in real time, thereby enabling facility management or efficient use of an idle space. In general, since a lighting device such as the LED lamp 5200 is disposed in almost all of the spaces on each floor of a building, various pieces of information in the building may be collected by a sensor integrated with the LED lamp 5200, and the collected information may be used to manage facilities or utilize an idle space.

A combination of the LED lamp 5200 with an image sensor, a storage device, the communications module for a lamp 5210, and the like may allow the LED lamp 5200 to be utilized as a device that may maintain building security or detect and deal with an emergency. For example, when a smoke or temperature sensor is attached to the LED lamp 5200, the LED lamp 5200 may quickly detect whether a fire or the like occurs, thereby minimizing damage, and may also control the brightness of lighting considering external weather or an amount of sunshine, thereby saving energy and providing a comfortable lighting environment.

Figure 29:
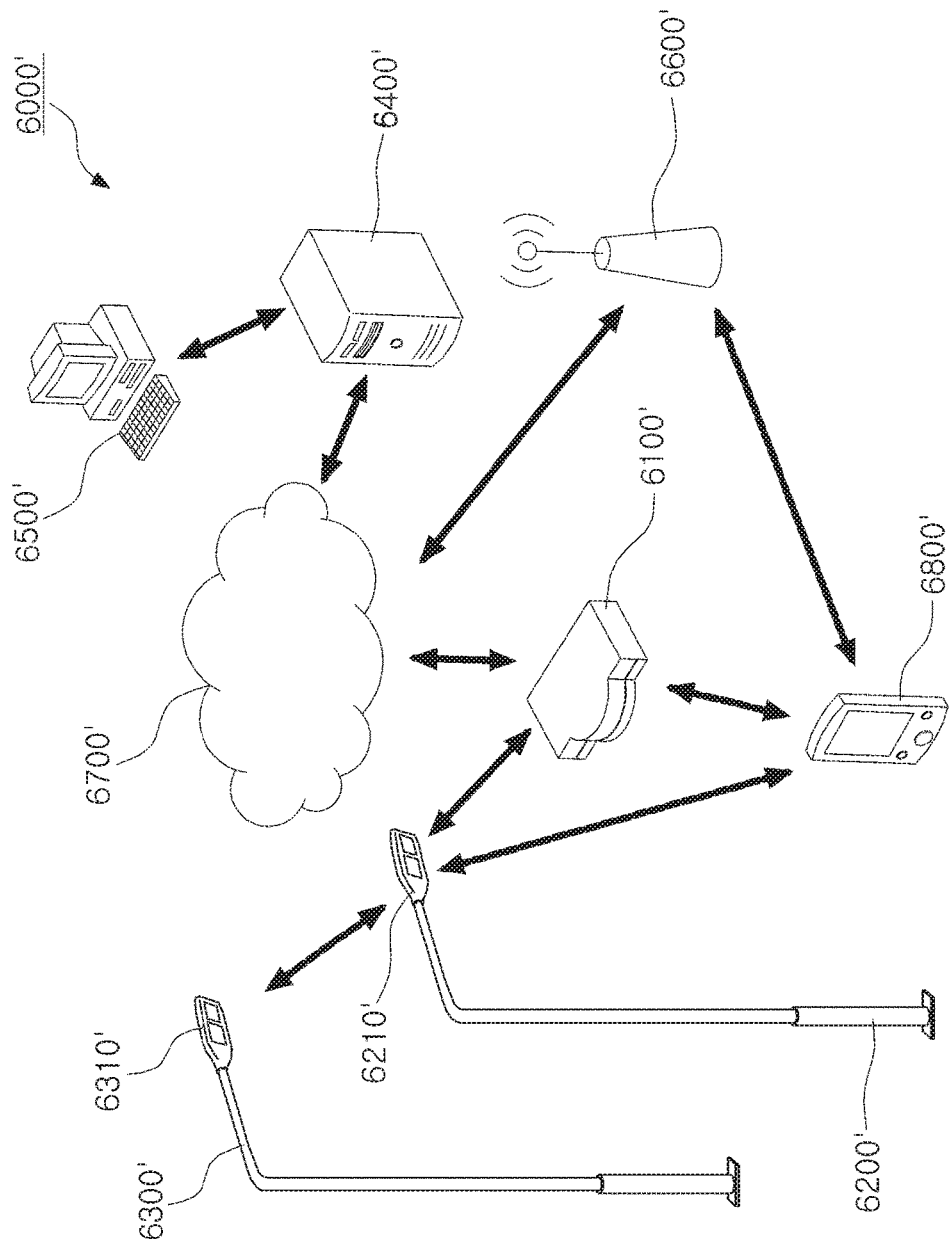
FIG. 29 is a schematic view of an open network system including a light emitting device package according to an example embodiment.

FIG. 29 is a schematic view of an open network system including a light emitting device package according to an example embodiment.

Referring to FIG. 29, a network system 6000' according to the present example embodiment may include a communications connection device 6100', a plurality of lighting fixtures 6200' and 6300' installed at predetermined intervals and connected to the communications connection device 6100' to communicate therewith, a server 6400', a computer 6500' managing the server 6400', a communications base station 6600', a communications network 6700' connecting the above-mentioned communicable devices, a mobile device 6800', and the like.

Each of the plurality of lighting fixtures 6200' and 6300' installed in an external open space, such as a street or a park, may include smart engines 6210' and 6310', respectively. Each of the smart engines 6210' and 6310' may include a sensor collecting information regarding surroundings, a communications module, and the like, in addition to a light emitting device emitting light and a driver driving the light emitting device. The communications module may allow the smart engines 6210' and 6310' to communicate with other surrounding devices according to communications protocols such as Wi-Fi, Zigbee®, and Li-Fi.

As an example, one smart engine 6210' may be connected to the other smart engine 6310' to communicate therewith. In this case, Wi-Fi extension technology (Wi-Fi mesh) may be applied to communications between the smart engines 6210' and 6310'. At least one smart engine 6210' may be connected to the communications connection device 6100' linked to the communications network 6700' through wired and wireless communications. In order to increase communications efficiency, several smart engines 6210' and 6310' may be grouped into one to be connected to a single communications connection device 6100'.

The communications connection device 6100' may relay communications between the communications network 6700' and other devices, as an access point (AP) that enables wired and wireless communications. The communications connection device 6100' may be connected to the communications network 6700' by at least one of wired and wireless communications methods, and may, as an example, be mechanically accommodated in one of the lighting fixtures 6200' and 6300'.

The communications connection device 6100' may be connected to the mobile device 6800' using a communications protocol such as Wi-Fi. A user of the mobile device 6800' may receive information regarding surroundings collected by a plurality of smart engines 6210' and 6310' through a communications connection device 6100' connected to the smart engine 6210' of an adjacent surrounding lighting fixture 6200'. The information regarding the surroundings may include surrounding traffic information, weather information, and the like. The mobile device 6800' may be connected to the communications network 6700' by a wireless cellular communications method such as 3G or 4G.

Meanwhile, the server 6400' connected to the communications network 6700' may monitor operational states or the like of the respective lighting fixtures 6200' and 6300' while receiving information collected by the smart engines 6210' and 6310' respectively mounted in the lighting fixtures 6200' and 6300'. In order to manage the respective lighting fixtures 6200' and 6300' on the basis of the monitoring results of the operational states of the respective lighting fixtures 6200' and 6300', the server 6400' may be connected to the computer 6500' providing a management system. The computer 6500' may execute software or the like able to monitor and manage operational states of the respective lighting fixtures 6200' and 6300', particularly, the smart engines 6210' and 6310'.

Figure 30:
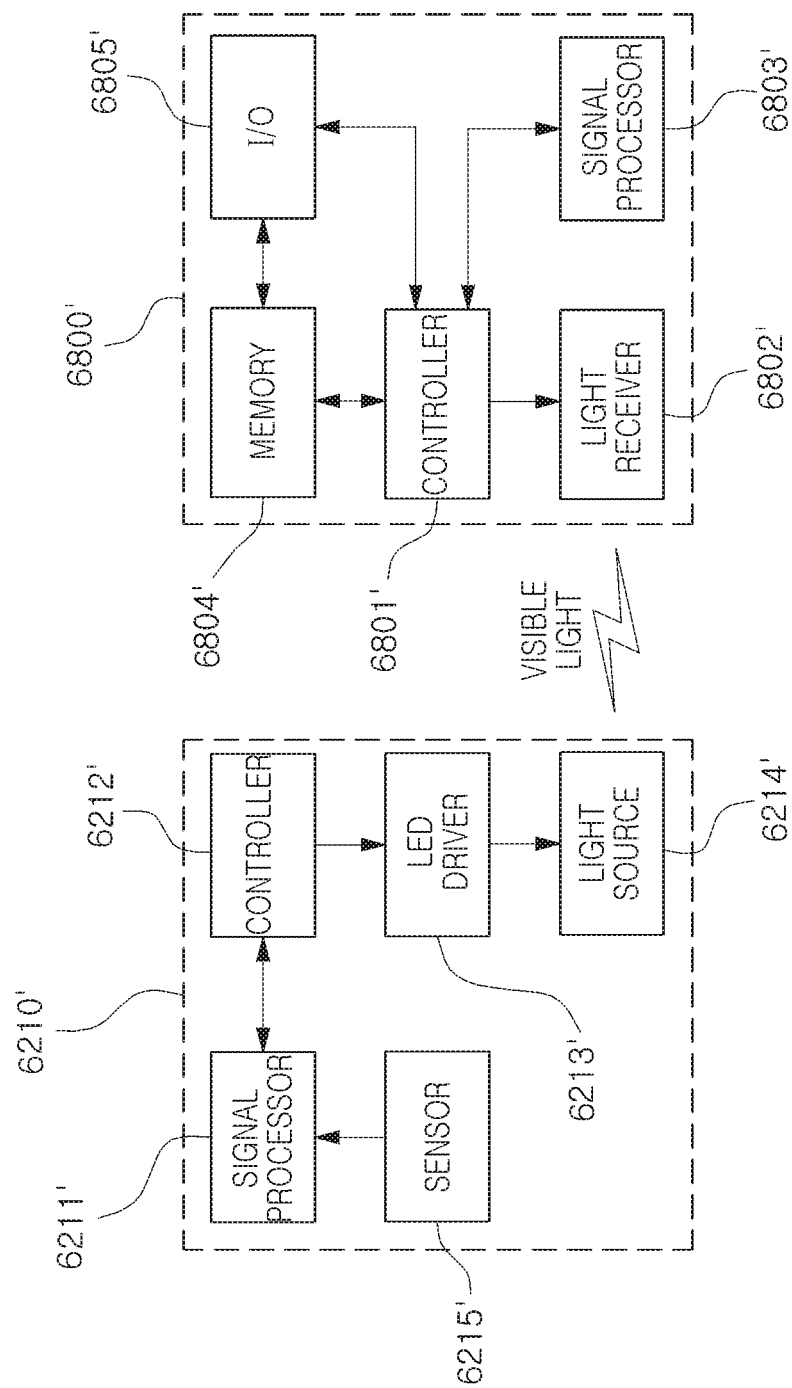
FIG. 30 is a block diagram illustrating communications operations between a smart engine of a lighting device and a mobile device through visible light communications including a light emitting device package according to an example embodiment.

FIG. 30 is a block diagram illustrating communications operations between a smart engine of a lighting device and a mobile device through visible light communications including a light emitting device package according to an example embodiment.

Referring to FIG. 30, a smart engine 6210' may include a signal processor 6211', a controller 6212', an LED driver 6213', a light source 6214', a sensor 6215', and the like. A mobile device 6800' connected to the smart engine 6210' through visible light communications may include a controller 6801', a light receiver 6802', a signal processor 6803', a memory 6804', and an input/output (I/O) 6805'. The light sources 6214 may include a light emitting device package according to an example embodiment described above.

Visible light communications technology, Li-Fi, may be used to wirelessly transmit information using light in the visible spectrum that can be recognized by the human eye. Such visible light communications technology may be distinguished from conventional wired optical communications technology and wireless infrared light communications in terms of using light in a visible spectrum, that is, a certain visible light frequency from the light emitting device package according to one of the above-described example embodiments, and may be differentiated from wired optical communications technology in terms of a wireless communications environment. The visible light communications technology may also be convenient in that the visible light communications technology may be freely used without being restricted or permitted in terms of use of frequency, unlike radio frequency (RF) wireless communications, may be distinctive in that physical security is excellent and a user may be able to see a communications link with the naked eye, and principally, may have a characteristic of convergence technology that obtains both a unique purpose as a light source and a communications function.

The signal processor 6211' of the smart engine 6210' may process data that is desired to be transmitted and received by visible light communications. As an example, the signal processor 6211' may process information collected by the sensor 6215' into data and transmit the data to the controller 6212'. The controller 6212' may control operations of the signal processor 6211', the LED driver 6213', and the like, and in particular, may control operations of the LED driver 6213' on the basis of data transmitted from the signal processor 6211'. The LED driver 6213' may transmit data to the mobile device 6800' by allowing the light source 6214' to emit light in response to a control signal transmitted from the controller 6212'.

The mobile device 6800' may include the light receiver 6802' recognizing visible light including data in addition to the controller 6801', the memory 6804' storing data, the I/O 6805' including a display, a touchscreen, an audio output unit, and the like, and the signal processor 6803'. The light receiver 6802' may detect visible light and convert the detected visible light into an electrical signal, and the signal processor 6803' may decode data included in the electrical signal converted by the light receiver 6802'. The controller 6801' may store the data decoded by the signal processor 6803' to the memory 6804' or output the decoded data through the I/O 6805' or the like in such a manner that a user may recognize the decoded data.

As set forth above, according to various example embodiments, a light emitting device package with improved light extraction efficiency and a low cost of manufacturing may be provided.

While example embodiments have been shown and described above, it will be apparent to those skilled in the art that modifications and variations could be made without departing from the scope of the inventive concept as defined by the appended claims.

What is claimed is:

1. A light emitting device package comprising:
a light emitting stack comprising a first conductivity-type semiconductor layer, an active layer, a second conductivity-type semiconductor layer sequentially stacked, the light emitting stack having a first surface provided by the first conductivity-type semiconductor layer, and a second surface provided by the second conductivity-type semiconductor layer and opposing the first surface;
a sealing portion disposed adjacent to the light emitting stack;
a first electrode structure disposed to cover edges of the light emitting stack and connected to the first conductivity-type semiconductor layer;
an insulating layer disposed between the light emitting stack and the sealing portion and extending under a portion of the first electrode structure; and
a first metal pad disposed on the second surface of the light emitting stack, and passing through the insulating layer at a side of the light emitting stack to connect to the first electrode structure.

2. The light emitting device package of claim 1, further comprising:
a second electrode structure disposed on the second surface of the light emitting stack and connected to the second conductivity-type semiconductor layer; and
a second metal pad disposed on the second surface of the light emitting stack, and passing through the insulating layer to connect to the second electrode structure.

3. The light emitting device package of claim 1, wherein the first electrode structure surrounds the light emitting stack along edges of the first surface of the light emitting stack.

4. The light emitting device package of claim 3, wherein the first electrode structure covers at least a portion of an upper surface of the insulating layer disposed adjacent to the first surface of the light emitting stack.

5. The light emitting device package of claim 2, wherein the first metal pad and the second metal pad are separated from each other on the second surface of the light emitting stack, and cover a side surface of the light emitting stack and extend adjacent to the first surface of the light emitting stack.

6. The light emitting device package of claim 1, wherein the insulating layer has a multilayer reflective structure in which a plurality of insulator films having different refractive indexes are alternately stacked.

7. The light emitting device package of claim 1, wherein the sealing portion comprises light-reflective particles.

8. The light emitting device package of claim 2, further comprising a first metal post connected to the first metal pad, and a second metal post connected to the second metal pad, each of the first and second metal posts having regions exposed from the sealing portion.

9. The light emitting device package of claim 1, further comprising a phosphor layer formed on the first conductivity-type semiconductor layer.

10. A light emitting device package comprising:
a light emitting stack having a plurality of layers arranged in a mesa structure;
a first electrode structure disposed to cover edges of the light emitting stack while exposing a upper conductive layer of the light emitting stack, the first electrode structure being electrically connected to the upper conductive layer;
a second electrode structure disposed on and electrically connected to a bottom conductive surface of the light emitting stack;
an insulating layer disposed on the second electrode structure and sides of the light emitting stack, and extending under a portion of the first electrode structure;

a first metal pad disposed on the insulating layer, the first metal pad being electrically connected to the first electrode structure through at least one first hole in the insulating layer; and a second metal pad disposed on the insulating layer, the second metal pad being electrically connected to the second electrode structure through at least one second hole in the insulating layer.

\* \* \* \* \*